United States Patent
Staple et al.

(10) Patent No.: US 6,859,580 B2
(45) Date of Patent: *Feb. 22, 2005

(54) SYSTEMS AND METHODS FOR OVERCOMING STICTION USING A LEVER

(75) Inventors: Bevan Staple, Longmont, CO (US); David Paul Anderson, Boulder, CO (US); Lilac Muller, Boulder, CO (US)

(73) Assignee: PTS Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/632,662

(22) Filed: Aug. 1, 2003

(65) Prior Publication Data

US 2004/0022483 A1 Feb. 5, 2004

Related U.S. Application Data

(63) Continuation of application No. 09/898,988, filed on Jul. 3, 2001, now Pat. No. 6,625,342.

(51) Int. Cl.[7] ............................. G02B 6/35; G02B 26/08
(52) U.S. Cl. ............................................ 385/18; 385/19
(58) Field of Search ..................................... 385/16–24

(56) References Cited

U.S. PATENT DOCUMENTS

| | | | |
|---|---|---|---|
| 4,330,175 A | 5/1982 | Fujii et al. | |
| 4,733,945 A | 3/1988 | Bacich | |
| 5,061,049 A | 10/1991 | Hornbeck | |
| 5,117,311 A | 5/1992 | Nomura | |
| 5,212,582 A | * 5/1993 | Nelson | 359/424 |
| 5,279,924 A | 1/1994 | Sakai et al. | |
| 5,392,151 A | 2/1995 | Nelson | |
| 5,414,540 A | 5/1995 | Patel et al. | |
| 5,493,452 A | 2/1996 | Hoshino et al. | |
| 5,523,878 A | 6/1996 | Wallace et al. | |
| 5,600,383 A | 2/1997 | Hornbeck | |
| 5,602,671 A | 2/1997 | Hornbeck | |
| 5,757,559 A | 5/1998 | Nomura et al. | |
| 5,768,649 A | 6/1998 | Pearson | |
| 5,867,302 A | 2/1999 | Fleming | |
| 5,886,811 A | 3/1999 | Min | |
| 5,917,625 A | 6/1999 | Ogusu et al. | |
| 5,960,133 A | 9/1999 | Tomlinson | |
| 5,991,066 A | 11/1999 | Robinson et al. | |
| 5,999,288 A | 12/1999 | Ellinas et al. | |
| 5,999,672 A | 12/1999 | Hunter et al. | |
| 6,025,951 A | * 2/2000 | Swart et al. | 359/245 |
| 6,028,689 A | * 2/2000 | Michalicek et al. | 359/224 |
| 6,040,935 A | 3/2000 | Michalicek | |
| 6,052,232 A | 4/2000 | Iwaka | |
| 6,097,519 A | 8/2000 | Ford | |
| 6,097,859 A | 8/2000 | Solgaard | |

(List continued on next page.)

OTHER PUBLICATIONS

Phillippe, P. et al., "Wavelength demultiplexer: using echelette gratings on silicon substrate," Applied Optics, vol. 24, No. 7, Apr. 1, 1985.

(List continued on next page.)

*Primary Examiner*—Michelle R. Connelly-Cushwa
(74) *Attorney, Agent, or Firm*—Townsend and Townsend and Crew LLP

(57) ABSTRACT

A microstructure is provided including a base layer underlying a first and second structural plates. Operation of the microstructure is capable of overcoming stiction. Methods of operation include providing an edge of the first structural plate in contact with a contact point. A second structural plate is deflected in a way that overcomes stiction between the first structural plate and the contact point. Such deflection can include providing a prying force to lift the first structural plate or a hammering force to disturb any stiction related forces at the contact point.

13 Claims, 14 Drawing Sheets

U.S. PATENT DOCUMENTS

| | | | |
|---|---|---|---|
| 6,097,863 | A | 8/2000 | Dell et al. |
| 6,108,471 | A | 8/2000 | Zhang et al. |
| 6,128,122 | A | 10/2000 | Drake et al. |
| 6,147,790 | A | 11/2000 | Meier et al. |
| 6,220,561 | B1 | 4/2001 | Mueller |
| 6,263,127 | B1 | 7/2001 | Dragone et al. |
| 6,307,657 | B1 | 10/2001 | Ford |
| 6,449,096 | B1 | 9/2002 | Fabiny et al. |
| 6,480,320 | B2 | 11/2002 | Nasiri |
| 6,501,877 | B1 | 12/2002 | Weverka et al. |
| 6,533,947 | B2 * | 3/2003 | Nasiri et al. .................. 216/2 |
| 6,535,319 | B2 | 3/2003 | Buzzetta et al. |
| 6,542,653 | B2 | 4/2003 | Wu et al. |
| 6,552,840 | B2 * | 4/2003 | Knipe ........................ 359/291 |
| 6,614,581 | B2 | 9/2003 | Anderson |
| 6,625,342 | B2 * | 9/2003 | Staple et al. ................. 385/18 |

OTHER PUBLICATIONS

Rallison, R. D., White Paper on: *Dense Wavelength Division Multiplexing (DWDM) and the Dickson Grating*, Jan. 6, 2001, 9 pages.

Schilling, M. et al., "Deformation–free overgrowth of reactive Ion beam etched submicron structures in InP by liquid phase epitaxy," Appl. Phys. Lett. 49 (12), Sep. 22, 1986.

Shams, Mohammad Kazem et al., *Preferential Chemical Etching Of Blazed Gratings in (110)–Oriented GaAs*, Optics Letters, Mar. 1979, vol. 4, No. 3, pges. 96–98.

Smith, M.S.D. et al., *Diffraction Gratings Utilizing Total Internal Reflection Facets In Littrow Configuration*, IEEE Photonics Technology Letters, Jan. 1, 1999, vol. 11, No. 1, pp. 84–86.

Sun, Z. J. et al., Demultiplexer with 120 channels and 0.29–nm Channel Spacing, IEEE Photonics Technology Letters, vol. 10, No. 1, Jan. 1998.

Tang, W. et al., "Electrostatically Balanced Comb Drive for Controlled Levitation," Reprinted from Technical Digest IEEE Solid–State Sensor and Actuator Workshop, Jun. 1990; pp. 198–202.

Torcheux, L. et al., "Electrochemical Coupling Effects on the Corrosion of Silicon Samples in HF Solutions," J. Electrochem.Soc., vol. 142, No. 6, Jun. 1995.

*Transducer Elements*, Piezo Systems, Inc., Cambridge MA, Catalog #3, 1998, pp. 30–45.

*Types and Characteristics of SDH Network Protection Architectures*, International Telecommunication Union (ITU–T), Recommendation G.941 Oct., 1998, pp. 1–132.

Vankessel, P. et al., "A MEMS–Based Projection Display," Proceedings of the IEEE, vol. 86, No. 8, Aug. 1998; pp. 1687–1704.

Wong, Ark–Chew et al., *Anneal–Activated, Tunable, 68 MHz Micromechanical Filters*, Center for Integrated Microsystems, Dept. of Electrical Engineering and Computer Science, University of Michigan, Ann Arbor, Michigan 48109, Transducers '99, Jun. 7–10, 1999, pp. 1390–1393, Sendai, Japan.

Akiyama, T. et al.; "Controlled Stepwise Motion In Polysilicon Microstructures," Journal of Microelectromechanical Systems, vol. 2, No. 3, Sep. 1993; pp. 106–110.

Ashruf, C.M.A. et al., "Galvanic porous silicon formation without external contacts," Sensors and Actuators 74 (1999) pp. 118–122.

Bean, Kenneth et al., "Anisotropic Etching of Silicon," IEEE Transactions on Electron Devices, vol. Ed–25, No. 10, Oct. 1978.

Ciarlo, Dino R. "A latching accelerometer fabricated by the anisotropic etching of (110) oriented silicon wafers," Lawrence Livermore Nat'l Laboratory, Mar. 1, 1992.

Dewa, A.S. et al., "Development of a Silicon Two–Axis Micromirror for an Optical CrossConnect," Solid State Sensors and Actuators Workshop, Hilton Head, South Carolina, pp. 93–96.

Ford, Joseph et al., "Wavelength Add Drop Switching Using Tilting Micromirros," Journal of Lightwave Technology, vol. 17, No. 5, May 1999.

Grade, J. et al., A Large–Deflection Electrostatic Actuator for Optical Switching Applications, Solid–State Sensor and Actuator Workshop, Hilton Head Island, South Carolina, Jun. 4–8, 2000; pp. 97–100.

Graf, U.U. et al., *Fabrication and Evaluation Of An Etched Infrared Diffraction Grating*, Applied Optics, Jan. 1, 1994, vol. 33, No. 1, pp. 96–102.

Hopkins, Robert E., *Some Thoughts On Lens Mounting*, Optical Engineering, Sep.–Oct. 1976, vol. 15, No. 5, pp. 428–430.

Kaajakari, V. et al.; "Ultrasonic Actuation for MEMS Dormancy–Related Stiction Reduction," In MEMS Reliability for Critical Applications, Proceedings of SAPIE vol. 4180 (2000); pp. 60–65.

Keller, C. Dissertation entitled: Microfabricated Silicon High Aspect Ratio Flexures for In–Plane Motion, Fall 1998.

Keller, Luke D. et al., *Fabrication And Testing Of Chemically Micromachined Silicon Echelle Gratings*, Applied Optics, Mar. 1, 2000, vol. 39, No. 7, pp. 1094–1105.

Koch, T.L. et al., "Anisotropically etched deep gratings for InP/InGaAsP optical devices," J.App. Phys. 62 (8), Oct. 15, 1987.

Loewen, Erwin G. et al., *Diffraction Gratings and Applications*, Marcel Dekker, Inc., New York—Basel, Chapter 4, pp. 132–136 and Chapter 8 pp. 300–301.

Muller, L. Dissertation entitled: Gimballed Electrostatic Microactuators with Embedded Interconnects, Spring 2000.

Nishi, I. et al., "Broad–Passband–Width Optical Filter for Multi–Demultiplexer Using a Diffraction Grating and a Retroreflector Prism," Electronics Letters, vol. 21, No. 10, $9^{th}$ May 1985.

* cited by examiner

SYSTEMS AND METHODS FOR OVERCOMING STICTION USING A LEVER

CROSS-REFERENCES TO RELATED APPLICATIONS

This application is a Continuation of U.S. patent application Ser. No. 09/898,988 now U.S. Pat. No. 6,625,342, filed Jul. 3, 2001, entitled "SYSTEMS AND METHODS FOR OVERCOMING STICTION USING A LEVER". This application is assigned to a common entity and is herein incorporated by reference in its entirety for all purposes.

This application is further related to the following U.S. patent applications: U.S. application Ser. No. 09/899,002 now U.S. Pat. No. 6,701,037, filed Jul. 3, 2001, entitled: "MEMS-BASED NONCONTACTING FREE-SPACE OPTICAL SWITCH"; U.S. application Ser. No. 09/899,014 now U.S. Pat. No. 6,614,581, filed Jul. 3, 2001, entitled: "METHODS AND APPARATUS FOR PROVIDING A MULTI-STOP MICROMIRROR"; and U.S. application Ser. No. 09/899,004 now U.S. Pat. No. 6,657,759, filed Jul. 3, 2001, entitled: "BISTABLE MICROMIRROR WITH CONTACTLESS STOPS,"; all of which are assigned to a common entity and are herein incorporated by reference in their entirety for all purposes.

BACKGROUND OF THE INVENTION

This invention relates generally to the field of micro-electrical-mechanical systems (MEMS), and in particular, to improved MEMS devices and methods for their use with fiber-optic communications systems.

The Internet and data communications are causing an explosion in the global demand for bandwidth. Fiber optic telecommunications systems are currently deploying a relatively new technology called dense wavelength division multiplexing (DWDM) to expand the capacity of new and existing optical fiber systems to help satisfy this demand. In DWDM, multiple wavelengths of light simultaneously transport information through a single optical fiber. Each wavelength operates as an individual channel carrying a stream of data. The carrying capacity of a fiber is multiplied by the number of DWDM channels used. Today DWDM systems employing up to 80 channels are available from multiple manufacturers, with more promised in the future.

In all telecommunication networks, there is the need to connect individual channels (or circuits) to individual destination points, such as an end customer or to another network. Systems that perform these functions are called cross-connects. Additionally, there is the need to add or drop particular channels at an intermediate point. Systems that perform these functions are called add-drop multiplexers (ADMs). All of these networking functions are currently performed by electronics—typically an electronic SONET/SDH system. However SONET/SDH systems are designed to process only a single optical channel. Multi-wavelength systems would require multiple SONET/SDH systems operating in parallel to process the many optical channels. This makes it difficult and expensive to scale DWDM networks using SONET/SDH technology.

The alternative is an all-optical network. Optical networks designed to operate at the wavelength level are commonly called "wavelength routing networks" or "optical transport networks" (OTN). In a wavelength routing network, the individual wavelengths in a DWDM fiber must be manageable. New types of photonic network elements operating at the wavelength level are required to perform the cross-connect, ADM and other network switching functions. Two of the primary functions are optical add-drop multiplexers (OADM) and wavelength-selective cross-connects (WSXC).

In order to perform wavelength routing functions optically today, the light stream must first be de-multiplexed or filtered into its many individual wavelengths, each on an individual optical fiber. Then each individual wavelength must be directed toward its target fiber using a large array of optical switches commonly called an optical cross-connect (OXC). Finally, all of the wavelengths must be re-multiplexed before continuing on through the destination fiber. This compound process is complex, very expensive, decreases system reliability and complicates system management. The OXC in particular is a technical challenge. A typical 40–80 channel DWDM system will require thousands of switches to fully cross-connect all the wavelengths. Conventional opto-mechanical switches providing acceptable optical specifications are too big, expensive and unreliable for widespread deployment.

In recent years, micro-electrical-mechanical systems (MEMS) have been considered for performing functions associated with the OXC. Such MEMS devices are desirable because they may be constructed with considerable versatility despite their very small size. In a variety of applications, MEMS component structures may be fabricated to move in such a fashion that there is a risk of stiction between that component structure and some other aspect of the system. One such example of a MEMS component structure is a micromirror, which is generally configured to reflect light from two positions. Such micromirrors find numerous applications, including as parts of optical switches, display devices, and signal modulators, among others.

In many applications, such as may be used in fiber-optics applications, such MEMS-based devices may include hundreds or even thousands of micromirrors arranged as an array. Within such an array, each of the micromirrors should be accurately aligned with both a target and a source. Such alignment is generally complex and typically involves fixing the location of the MEMS device relative to a number of sources and targets. If any of the micromirrors is not positioned correctly in the alignment process and/or the MEMS device is moved from the aligned position, the MEMS device will not function properly.

In part to reduce the complexity of alignment, some MEMS devices provide for individual movement of each of the micromirrors. An example is provided in FIGS. 1A–1C illustrating a particular MEMS micromirror structure that may take one of three positions. Each micromirror 116 is mounted on a base 112 that is connected by a pivot 108 to an underlying base layer 104. Movement of an individual micromirror 116 is controlled by energizing actuators 124*a* and/or 124*b* disposed underneath base 112 on opposite sides of pivot 108. Hard stops 120*a* and 120*b* are provided to limit movement of base 112. Energizing left actuator 124*a* causes micromirror 116 to tilt on pivot 108 towards the left side until one edge of base 112 contacts left hard stop 120*a*, as shown in FIG. 1A. In such a tilted position, a restoring force 150, illustrated as a direction arrow, is created in opposition to forces created when left actuator 124*a* is energized.

Alternatively, right actuator 124*b* may be energized to cause the micromirror 116 to tilt in the opposite direction, as shown in FIG. 1B. In such a tilted position, a restoring force 160, illustrated as a direction arrow, is created in opposition to forces created when right actuator 124*b* is energized. When both actuators 124 are de-energized, as shown in FIG.

1C, restoring forces 150, 160 cause micromirror 116 to assume a horizontal static position. Thus, micromirror 116 may be moved to any of three positions. This ability to move micromirror 116 provides a degree of flexibility useful in aligning (including aligning, pointing,and/or steering) the MEMS device, however, alignment complexity remains significant.

In certain applications, once the micromirror is moved to the proper position, it may remain in that position for ten years or more. Thus, for example, one side of an individual micromirror may remain in contact with the hard stop for extended periods. Maintaining such contact increases the incidence of dormancy related stiction. Such stiction results in the micromirror remaining in a tilted position after the actuators are de-energized. Some theorize that stiction is a result of molecule and/or charge build-up at the junction between the micromirror and the hard stop. For example, it has been demonstrated that capillary forces due to an accumulation of $H_2O$ molecules at the junction increases the incidence of stiction.

Thus, one solution to overcome stiction is to package the MEMS device in a hermetic or inert environment. Such an environment reduces the possibility of molecule accumulation at the junction. However, such packaging is costly and prone to failure where seals break or are not properly formed. Further, such packaging is incompatible with many types of MEMS devices. In addition, such packaging does not reduce stiction related to charge build-up at the junction.

In "Ultrasonic Actuation for MEMS Dormancy-Related Stiction Reduction", Proceedings of SPIE Vol. 4180 (2000), Ville Kaajakari et al. describe a system for overcoming both molecule and charge related stiction. The system operates by periodically vibrating an entire MEMS device to release stiction forces. In this way, the stiction forces are overcome. While there is evidence that vibrating the entire MEMS device can overcome stiction, such vibration causes temporary or even permanent misalignment of the device. Thus, freeing an individual micromirror often requires a costly re-alignment procedure. Even where the device is not permanently misaligned by the vibration, it is temporarily dysfunctional while the vibration is occurring.

Thus, there exists a need in the art for systems and methods for increasing alignment flexibility of MEMS devices and for overcoming stiction in MEMS devices without causing misalignment.

SUMMARY OF THE INVENTION

The present invention provides improved MEMS devices for use with all optical networks, and methods of using and making the same. Therefore, some embodiments of the invention include a structural plate comprising a micromirror. For example, the present invention may be used with the exemplary wavelength routers described in co-pending U.S. patent application Ser. No. 09/422,061 now U.S. Pat. No. 6,501,877, filed Nov. 16, 1999, the complete disclosure of which is herein incorporated by reference.

Embodiments of the present invention comprise methods and apparatus related to overcoming stiction in electromechanical devices. In an embodiment, the stiction is between a structural plate and a contact point. The method of overcoming the stiction includes providing a base layer underlying a first and a second structural plates. An edge of the first structural plate is in contact with the contact point. The second structural plate is deflected in a way that overcomes the stiction between the first structural plate and the contact point.

In some embodiments, deflecting the second structural plate causes a prying force on the first structural plate, while in other embodiments, deflecting the second structural plate causes a hammering force on the first structural plate. In both types of embodiments, the forces are useful to overcome stiction.

Further, some embodiments of the present invention pertain to a wavelength router including a control member disposed adjacent to a micromirror assembly. The control member can be used in relation to the micromirror assembly to overcome stiction. Other embodiments include computer readable code for execution by a microprocessor to configure plates relative to a base layer in a micromirror device. Configuring the plates comprises moving one plate to contact a base layer, while moving another plate to contact the first. In some embodiments, the contact between the two plates acts to dislodge stiction causing molecules. In other embodiments, the contact between the plates provides a lever useful for overcoming stiction related forces. In yet other embodiments, the contact between the two plates results in adding restorative forces associated with both plates in a way that overcomes stiction related forces.

Other objects, features and advantages of the present invention will become more fully apparent from the following detailed description, the appended claims and the accompanying drawings.

BRIEF DESCRIPTION OF THE DRAWINGS

A further understanding of the nature and advantages of the present invention may be realized by reference to the figures which are described in remaining portions of the specification. In the figures, like reference numerals are used throughout several to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DESCRIPTION OF THE SPECIFIC EMBODIMENTS

1. Definitions

Figure 1A:
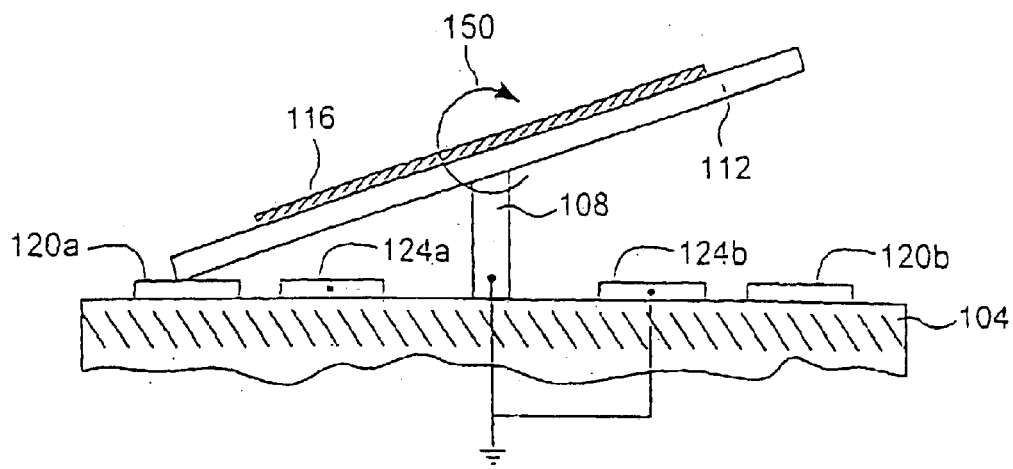
FIGS. 1A, 1B, and 1C are cross-sectional drawings of a tilting micromirror in three positions effected by actuation of different actuators.
Figure 1B:
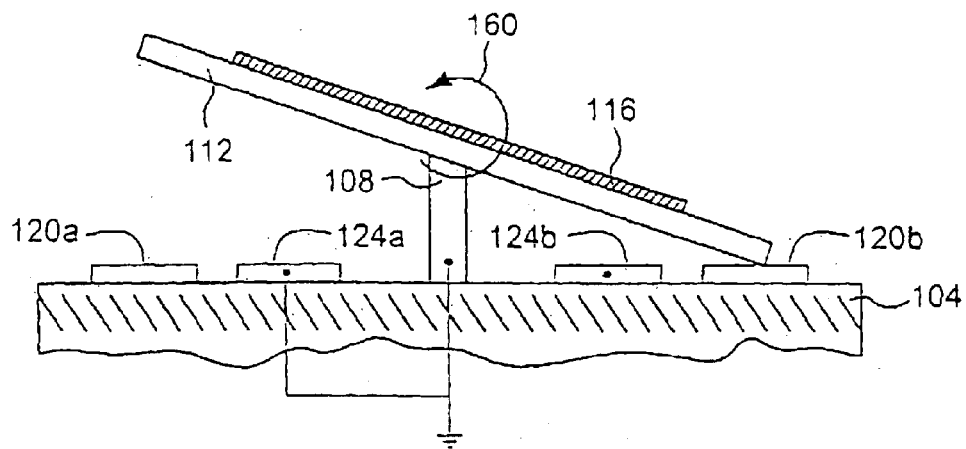
Figure 1C:
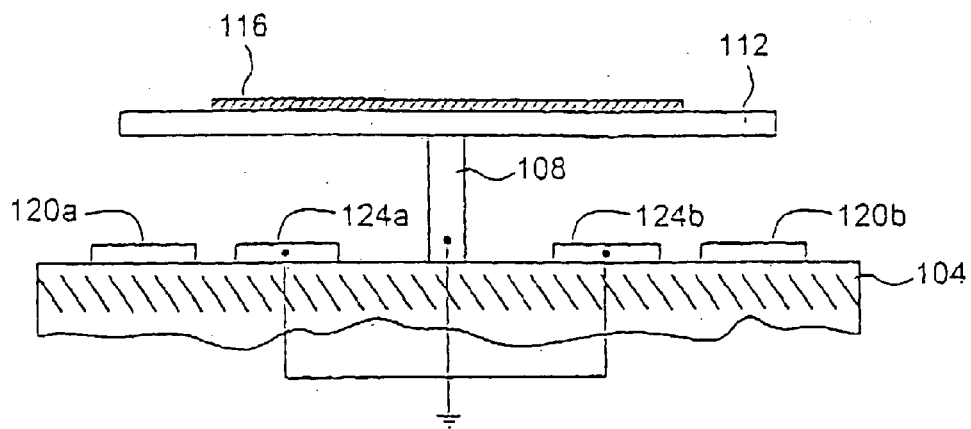

For purposes of this document, a structural plate refers to a substantially planar structure disposed on or about a pivot. The structural plate can be a rectangular plate, or other such member, capable of movement on the pivot. Such movement can be opposed by a restoring force developed at the pivot where the pivot is a torsion beam or bending beam. Thus, the structural plate can be deflected by applying a force to the structural plate and when the force is removed, the structural plate returns to a static position. Therefore, the static position for a structural plate with associated restorative forces is the position assumed by the structural plate due to restorative forces acting in the absence of other external forces, such as, electric fields. In addition, structural plates can include a cantilever plate where one edge of the structural plate is closer to the pivot than an opposite edge. Further, such structural plates can exhibit any dimensions including very narrow rectangles, squares, and/or other shapes, such as, for example, an elliptically shaped structural plate.

The pivot can be any member capable of supporting the structural plate in a way that allows the structural plate to deflect or tilt to one or more sides. For example, the pivot can be a post disposed near the center of a rectangular shaped structural plate. Alternatively, the pivot can be a rectangular shaped plate disposed across a pivot axis of the structural plate. Yet another alternative includes a series of two or more posts disposed across a pivot axis of the structural plate. Thus, one of ordinary skill in the art will recognize a number of other members and/or geometries which are suitable as pivots.

2. Introduction

Embodiments of the invention are directed to MEMS methods and devices in which a microstructure is moved between a plurality of tilt positions. Selection between the plurality of tilt positions is controlled by deflecting various control members into positions which define stop positions for the microstructure. In certain embodiments, the microstructure is a micromirror mounted as a cantilever that may be deflected between at least three stop positions, wherein one of the stop positions is a static position. In other embodiments, the microstructure is a structural plate capable of deflection to either the right or the left, wherein the structural plate may be deflected to five or more stop positions. In such embodiments, two of the stop positions involve a tilt to the left, two of the stop positions involve a tilt to the right, and one of the stop positions is a static position. In yet other embodiments, the microstructure is a structural plate mounted on a post and capable of deflection to the right, left, front, rear, or any combination thereof. In such embodiments, each of a tilt to the right, left, front, or rear can involve a plurality of stop positions.

Thus, the present invention provides for a number of stop positions allowing the micromirror to assume a wide variety of alignment positions. Providing such a variety of alignment positions facilitates alignment of a MEMS device. Therefore, the present invention is particularly applicable to optical-switch applications and thus, some of the embodiments are directed to a wavelength router that uses optical switching. As will be clear to those of skill in the art from the following description, the invention may be adapted to different types of MEMS devices and/or micromirror configurations. For example, the invention is applicable to microstructures using a number of control members and/or actuators relative to the microstructure to provide a variety of stop positions.

In addition, some embodiments of the present invention comprise methods for overcoming stiction in a MEMS device. In some embodiments, such methods employ the control members as levers to dislodge stiction causing molecules and/or charge. In other embodiments, methods of overcoming stiction employ the control member to apply a prying force to the microstructure to overcome any stiction related forces. Thus, the present invention is particularly applicable to applications or MEMS involving contacting structures, where stiction related problems are possible. Such applications can include, for example, MEMS devices where a microstructure is maintained in a deflected position for considerable periods of time.

3. Torsion-beam Micromirror

Figure 2:
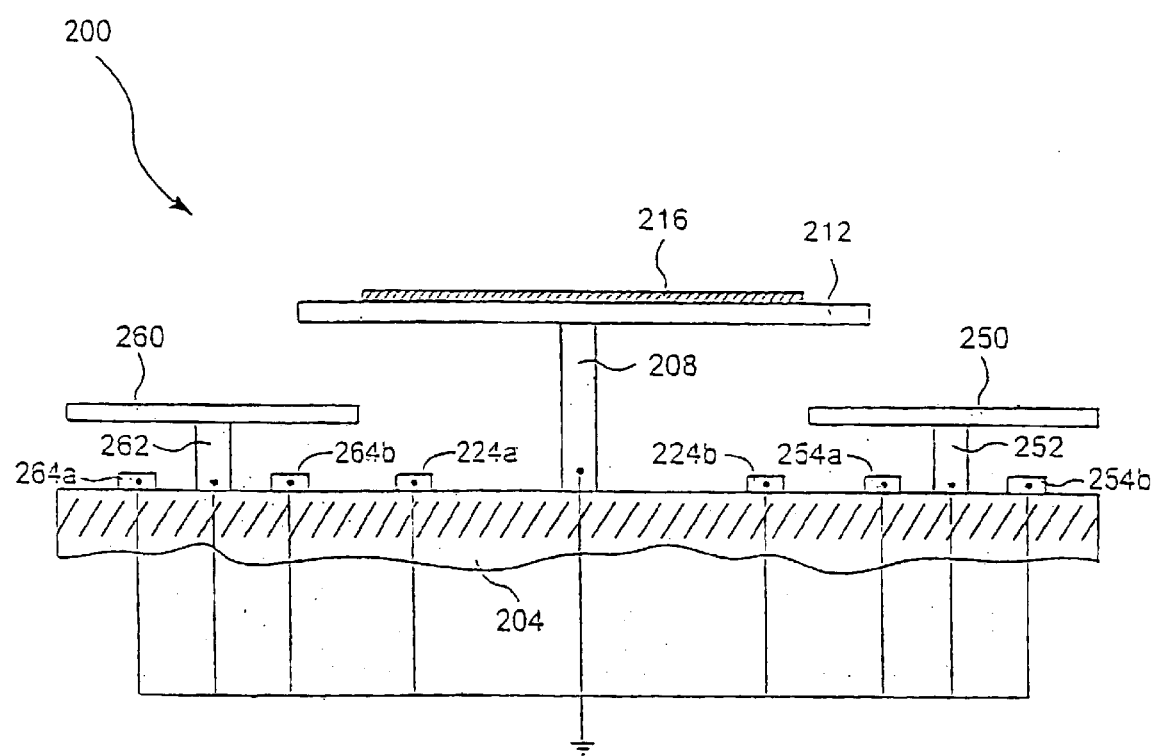
FIG. 2 is a cross-sectional drawing of a tilting micromirror surrounded on either side by tilting control plates.

FIG. 2 illustrates one embodiment of the invention applied to a structural plate micromirror system 200. Micromirror system 200 includes a micromirror 216 mounted on a structural plate 212 that is connected by at least one pivot member 208 to an underlying base layer 204. In some embodiments, multiple pivot members 208 are provided in the plane orthogonal to the page, the axis of rotation of the structural plate 212 being defined by the alignment of the pivot members. In one such embodiment, two pivot members 208 are provided approximately on opposite sides of micromirror 216 along the axis of rotation. Two mirror actuators 224a and 224b are provided on the base layer 204 and located on either side of pivot member 208.

Two control members (i.e. structural plates) 250, 260 are mounted on either side of pivot 208. Control member 250 is supported by at least one pivot 252 and control member 260 is supported by at least one pivot 262. Similar to pivot 208, pivots 252 and 262 can comprise multiple pivot members in the plane orthogonal to the page, the axis of rotation of the control members 250, 260 being defined by the alignment of the pivot members. Two control actuators 264a and 264b are mounted on either side of pivot 262 and two control actuators 254a and 254b are mounted on either side of pivot 252.

Mirror actuators 224, control actuators 254, 264, structural plate 212, control members 250, 260, and pivot members 208, 252, 262 may be fabricated using standard MEMS techniques. Such MEMS techniques typically involve a combination of depositing structural material, such as polycrystalline silicon, depositing sacrificial material, such as silicon oxide, and dissolving the sacrificial material during a release step, for example with hydrofluoric acid (HF). A number of such steps can be combined to produce the desired device. Further, in some embodiments, actuators 224, 254, 264 are metallized, for example with aluminum, and micromirror 216 is formed by depositing a layer of reflective metal, such as gold. In other embodiments, actuators 224, 254, 264 are formed of doped polysilicon or other electrically conductive materials. Such electrically conductive materials can also be used to form a reflective layer forming micromirror 216.

FIG. 2 shows micromirror system 200 in a static horizontal configuration of micromirror 216 and control members 250, 260. The static horizontal configuration is achieved when all actuators 224, 254, 264 are commonly grounded with pivots 208, 252, 262. In some embodiments, as illustrated in FIG. 2, each of structural plate 212, control member 250 and control member 260 may be deflected to a position tilted to the right or to the left. In other embodiments, control members 250, 260 can be cantilever members only capable of deflection to a position tilted to either the right or the left. In yet other embodiments, structural plate 212 can be a cantilever member capable of deflection to a right tilted position. In such embodiments, only control member 250 is provided. Of course, one of ordinary skill in the art will recognize a number of configurations for structural plate 212 and/or control members 250, 260.

In some embodiments, a single actuator is used to replace the actuator pair of actuators 264b and 224a and another single actuator is used to replace the actuator pair of actuators 254a and 224b. As will be apparent from the following discussion, many embodiments of the present invention involve actuating both actuators 264b and 224a or actuators 224b and 254a simultaneously. Thus, by replacing the actuator pairs with single actuators, the functionality of the present invention can be achieved with minimal actuators, wiring, and control logic.

4. Providing Multiple Deflection Positions

Figure 3A:
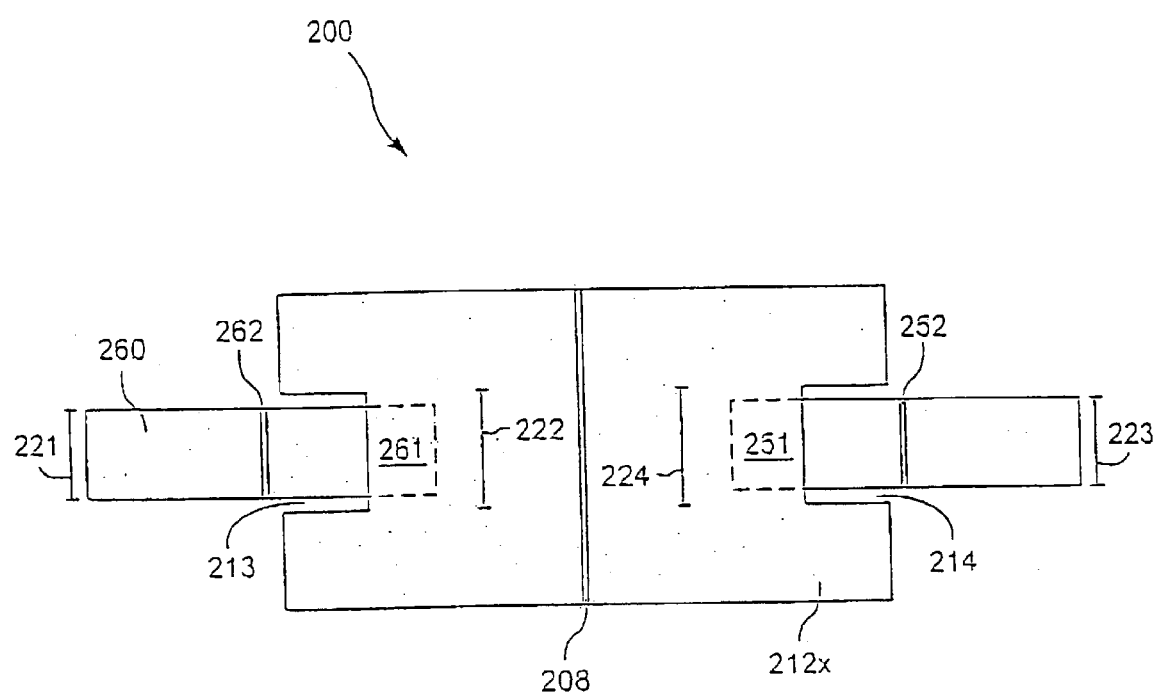
FIG. 3A is a top view of an embodiment of the micromirror and control plates of FIG. 2 where the micromirror is notched.

In the described embodiments, each of structural plate 212 and control members 250, 260 can be tilted to the right or to the left depending upon which actuators 224, 254, 264 are activated through application of a voltage V to that actuator with respect to the common ground. FIGS. 3 through 4 illustrate activation associated with multiple positions of structural plate 212. More specifically, FIG. 3A illustrates an embodiment of the present invention where structural plate 212 is notched (the notched structural plate indicated as 212x). FIGS. 3B through 3E illustrate tilt positions of notched structural plate 212x. Alternatively, FIG. 4A illustrates an embodiment of the present invention where structural plate 212 is not notched (the non-notched structural plate indicated as 212y) and FIGS. 4B and 4C illustrate tilt positions of non-notched structural plate 212y.

Figure 3B:
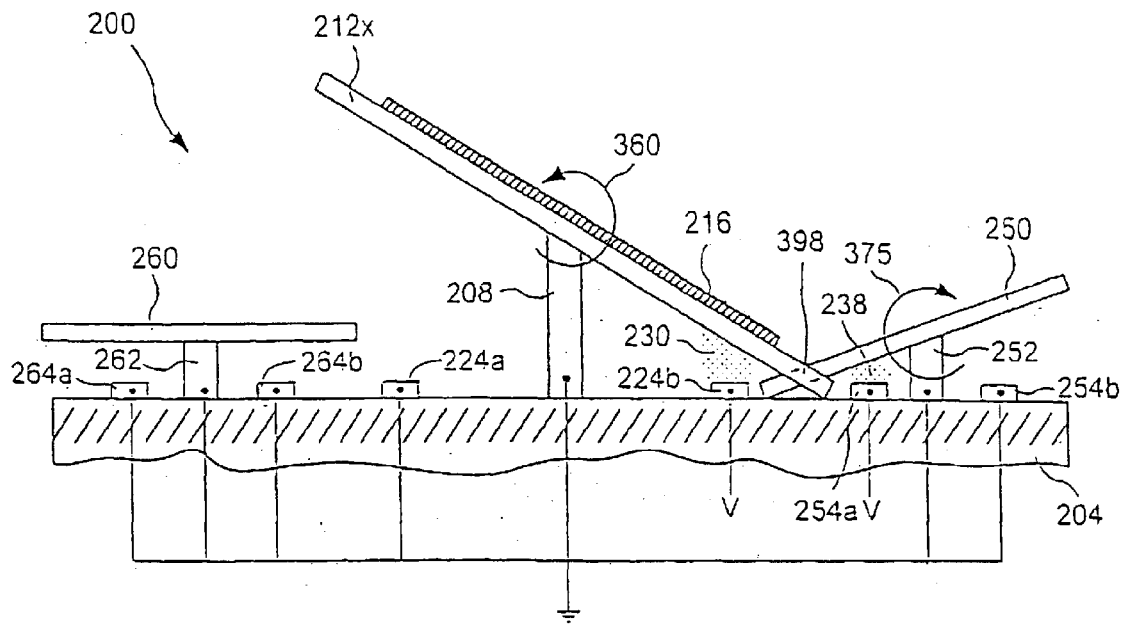
FIGS. 3B, 3C, 3D, and 3E are cross-sectional drawings of micromirror positions according to the present invention.
Figure 3C:
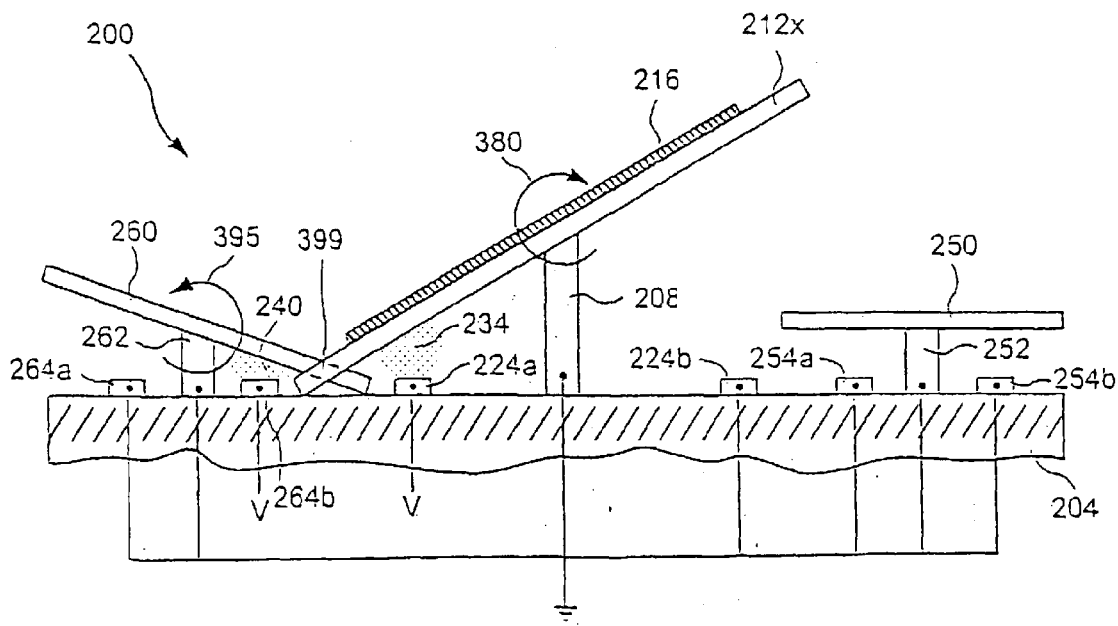

As illustrated in FIGS. 2, and 3B through 3C, a minimum of five tilt positions for the micromirror are achievable according to the present invention. More specifically, one position is the static position as shown in FIG. 2 where none of the actuators are energized. In addition, there are two right tilt positions illustrated in FIGS. 3B and 3D, respectively. Also, there are two left tilt positions illustrated in FIGS. 3C and 3E, respectively. Although not all of the tilt positions are illustrated, a similar number of tilt positions are achievable using both notched structural plate 212x and non-notched structural plate 212y.

While two tilt positions for both left and right tilts are illustrated, it should be recognized by one skilled in the art that more than two tilt positions for both left and right are possible. For example, additional control members 250, 260 could be fabricated according to the present invention at different physical locations which could provide additional hard stops (i.e. areas of material for stopping tilt of structural plate 212 and/or control members 250, 260 elevated above base layer 204) limiting the deflection of either structural plate 212x or 212y.

Referring to FIG. 3A, a top view of notched structural plate 212x is illustrated. As illustrated, notched structural plate 212x includes both a left notch 213 and a right notch 214. A width 222 of left notch 213 is greater than a width 221 of control member 260 and a width 224 of right notch 214 is greater than a width 223 of control member 250. Furthermore, structural plate 212x overlaps a right portion 261 of control member 260 and a left portion 251 of control member 250.

Referring to FIG. 3B, micromirror system 200 is illustrated with notched structural plate 212x deflected such that the right edge of notched structural plate 212x contacts base layer 204. To allow notched structural plate 212x to contact base layer 204, control member 250 is also deflected such that the left edge of control member 250 is in contact with base layer 204. In this position, right notch 214 of notched structural plate 212x covers control member 250 such that notched structural plate 212x does not contact control member 250 at an overlap point 398. However, it should be recognized by one of ordinary skill in the art that the depth of right notch 214 can be modified such that notched structural plate 212x does contact control member 250 rather than contacting base layer 204. Thus, by changing the depth of right notch 214, the angle of tilt of notched structural plate 212x can be selected.

To achieve the tilted position for control member 250, left control actuator 254a is activated, as shown in FIG. 3A, by applying a voltage V to that actuator with respect to the common ground. The potential difference between control member 250 and left control actuator 254a creates an electric field 238 indicated by dotted field lines. Such deflection of control member 250 results in an opposing restoring force 375, illustrated as a direction arrow.

Deflection of notched structural plate 212x is similarly caused by activating right mirror actuator 224b by applying a voltage V to the actuator. The potential difference between notched structural plate 212x and right mirror actuator 224b creates an electric field 230 indicated by dotted field lines. Electric field 230 causes structural plate 212 to deflect until it contacts base layer 204. Deflection of notched structural plate 212x results in an opposing restoring force 360, illustrated as a direction arrow.

The attractive force between actuators and an associated structural plate (control member 250, 260 or structural plate 212) varies by the inverse of the distance squared. Thus, for example, the attractive force causing notched structural plate 212x to deflect to a right tilt position becomes greater as the distance between notched structural plate 212x and right mirror actuator 224b decreases. Relying on this relationship, some embodiments provide for the tilt illustrated in FIG. 3B by activating right mirror actuator 224b and right control actuator 254b simultaneously. Because the distance between control member 250 and right control actuator 254b is less than the distance between notched structural plate 212x and right mirror actuator 224b, the force is greater between control member 250 and left control actuator 254a. This greater force causes control member 250 to deflect faster than notched structural plate 212x and therefore control member 250 is in contact with base layer 204 before notched structural plate 212x contacts base layer 204. Of course, the prior description assumes similar energy in electric fields 230 and 238, as well as, similar restoring forces 360 and 370. Also, it should be recognized that other sequences for energizing actuators are possible, for example, left control actuator 254a can be energized before right mirror actuator 224b.

As previously described, in some embodiments, actuators 224b and 254a can be combined into a single actuator. Thus, to achieve the tilt described in relation to FIG. 3B, only the single actuator replacing actuators 224b and 254a need be actuated to attract both control member 250 and notched structural plate 212x.

It should also be recognized that hard stops (not shown) can be fabricated on base layer 204 to limit any deflection of either notched structural plate 212x and/or control member 250. Thus, by fabricating a hard stop above base layer 204, the angle of tilt for notched structural plate 212x and control member 250 can be controlled. Also, it should be recognized that control member 250 can be maintained in the left tilt position held down by structural plate 212x after actuator 254a is deactivated.

Similar to the deflection described with reference to FIG. 3B, FIG. 3C illustrates notched structural plate 212x tilted to the left. Referring to FIG. 3C, notched structural plate 212x is deflected such that the left edge of notched structural plate 212x contacts base layer 204. To allow notched structural plate 212x to contact base layer 204, control member 260 is also deflected such that the right edge of control member 260 is in contact with base layer 204. In this position, left notch 213 of notched structural plate 212x covers control member 260 such that notched structural plate 212x does not contact control member 250 at an overlap point 399.

To achieve the tilted position for control member 260, right control actuator 264b is activated by applying a voltage V to that actuator with respect to the common ground. The potential difference between control member 260 and right control actuator 264b creates an electric field 240 indicated by dotted field lines. Such deflection of control member 260 results in an opposing restoring force 395, illustrated as a direction arrow.

Deflection of notched structural plate 212x is similarly caused by activating left mirror actuator 224a by applying a voltage V to the actuator. The potential difference between structural plate 212x and right mirror actuator 224a creates an electric field 234 indicated by dotted field lines. Electric field 234 causes structural plate 212 to deflect until it contacts base layer 204. Deflection of notched structural plate 212x results in an opposing restoring force 380, illustrated as a direction arrow.

Figure 3D:
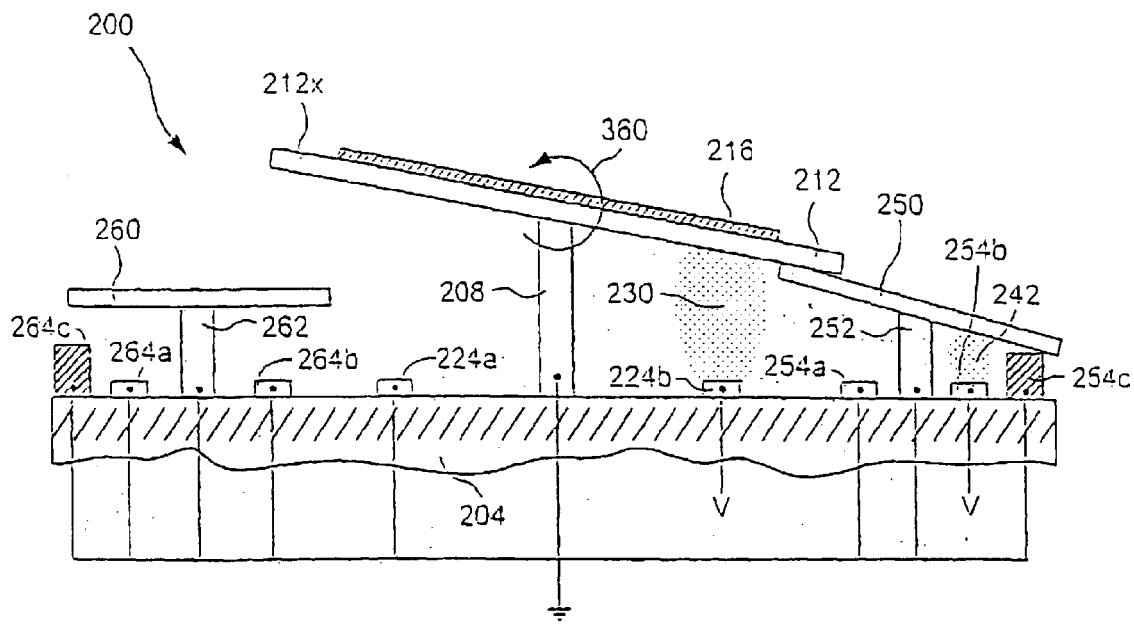
Figure 4A:
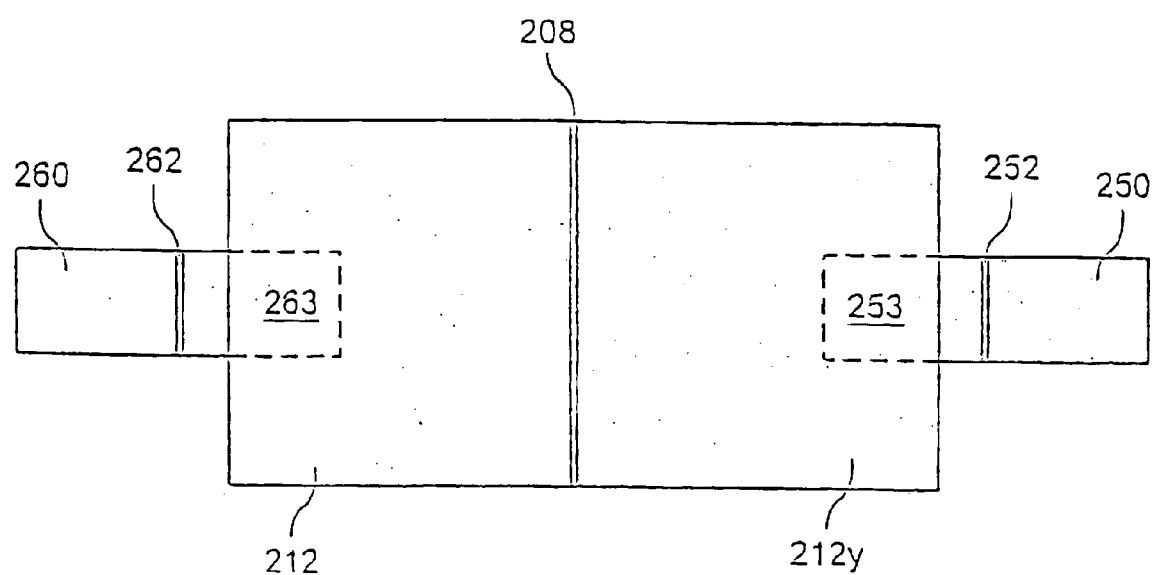
FIG. 4A is a top view of an embodiment of the micromirror and control plates of FIG. 2 where the micromirror is not notched.
Figure 4B:
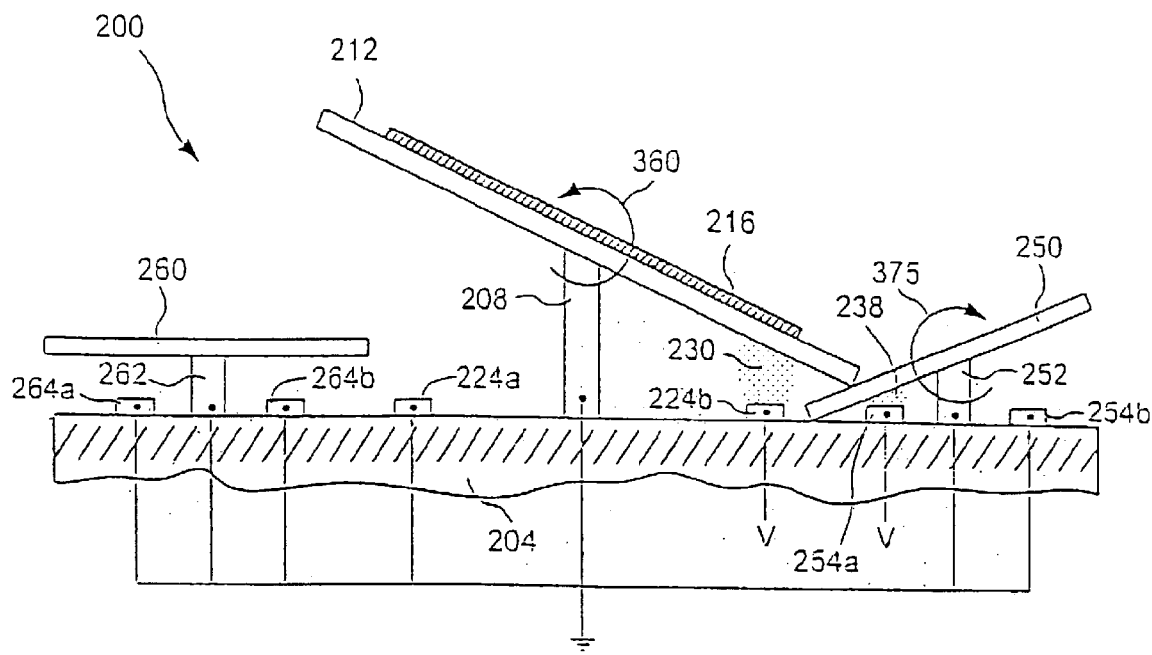
FIGS. 4B and 4C are cross-sectional drawings of the micromirror and a control plate of FIG. 2 displaced such that the micromirror contacts the control plate.
Figure 4C:
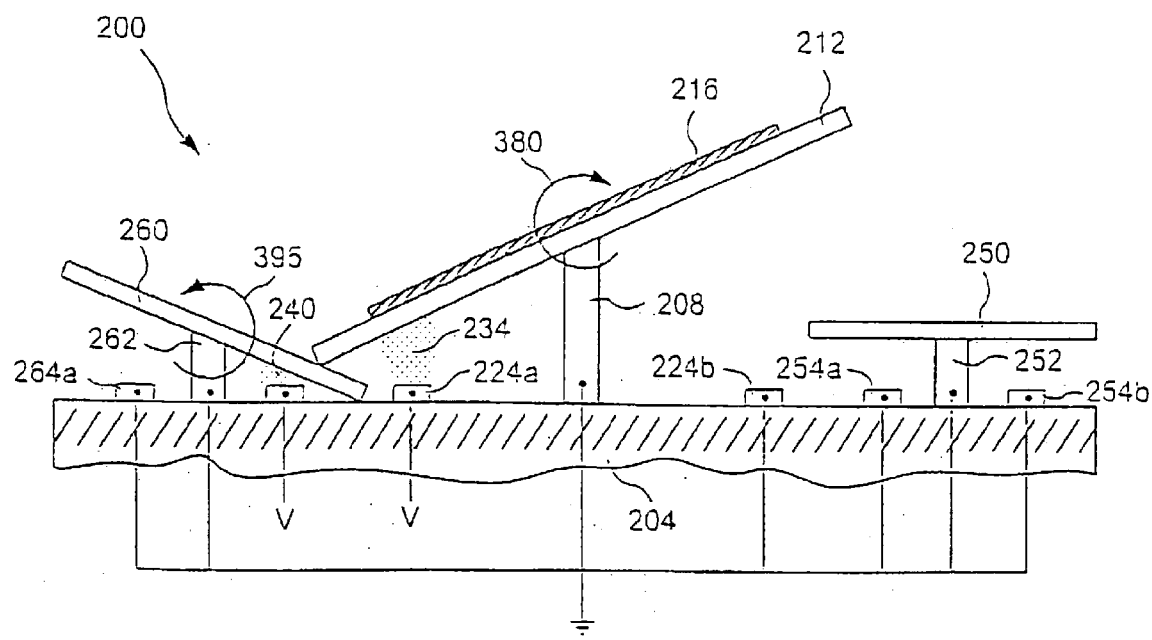

As illustrated in FIG. 3D, notched structural plate 212x can be tilted to a right position defined by control member 250. To achieve the position illustrated in FIG. 3D, right control actuator 254b is activated by applying a voltage V to the actuator. The potential difference between control member 250 and right control actuator 254b creates an electric field 242 indicated by dotted field lines. Electric field 242 causes control member 250 to deflect until it contacts right hard stop 254c. Thus, the height of right hard stop 254c directly controls the tilt angle of control member 250 and therefore, the tilt angle of notched structural plate 212x. Alternatively, in some embodiments, right hard stop 254c does not exist as illustrated in FIGS. 3B and 3C.

In addition, right mirror actuator 224b is activated which creates electric field 230. Electric field 230 causes notched structural plate 212x to deflect toward right mirror actuator 224b until notched structural plate 212x contacts control member 250.

As previously suggested, the amount of right tilt for notched structural plate 212x can be, in part, selected by the height of right hard stop 254c. As will be evident to one of ordinary skill in the art, the greater the height of right hard stop 254c the greater the right deflection for notched structural plate 212x. Alternatively, a reduction of height of right hard stop 254c similarly reduces the deflection possible for notched structural plate 212x.

Figure 3E:
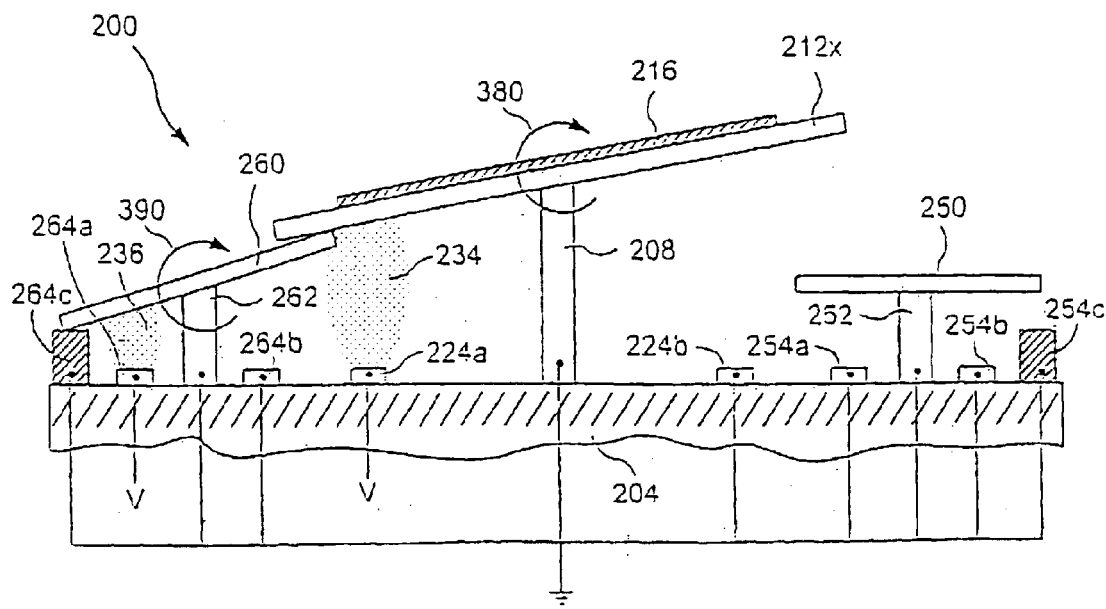

Notched structural plate 212x may similarly be deflected to the left to contact control member 260 as illustrated in FIG. 3E. To achieve the position illustrated in FIG. 3E, left control actuator 264a is activated by applying a voltage V to the actuator. The potential difference between control member 260 and left control actuator 264a creates an electric field 236 indicated by dotted field lines. Electric field 236 causes control member 260 to deflect until it contacts left hard stop 264c on base layer 204. In addition, left mirror actuator 224a is activated which creates electric filed 234. Electric field 234 causes notched structural plate 212x to deflect toward left mirror actuator 224a until notched structural plate 212x contacts control member 260.

Referring to FIG. 4A, a top view of a non-notched structural plate 212y is illustrated. As illustrated, non-notched structural plate 212y overlaps a right portion 263 of control member 260 and a left portion 253 of control member 250.

As illustrated in FIG. 4B, non-notched structural plate 212y can be tilted to a right position defined by control member 250. To achieve the position illustrated in FIG. 4B, left control actuator 254a is activated by applying a voltage V to the actuator. The potential difference between control member 250 and left control actuator 254a creates an electric field 238 indicated by dotted field lines. Electric field 238 causes control member 250 to deflect until it contacts base layer 204. Alternatively, in some embodiments, a side of control member 250 contacts a hard stop (not shown) fabricated on base layer 204.

In addition, right mirror actuator 224b is activated which creates electric field 230. Electric field 230 causes non-notched structural plate 212y to deflect toward right mirror actuator 224b until non-notched structural plate 212y contacts control member 250. The amount of right tilt for non-notched structural plate 212y can be, in part, selected by the overlap of non-notched structural plate 212y and control member 250.

Non-notched structural plate 212y may similarly be deflected to the left to contact control member 260 as illustrated in FIG. 4C. To achieve the position illustrated in FIG. 4C, right control actuator 264b is activated by applying a voltage V to the actuator. The potential difference between control member 260 and right control actuator 264b creates an electric field 240 indicated by dotted field lines. Electric field 240 causes control member 260 to deflect until it contacts base layer 204 or a hard stop (not shown) on base layer 204. In addition, left mirror actuator 224a is activated which creates electric filed 234. Electric field 234 causes non-notched structural plate 212y to deflect toward left mirror actuator 224a until non-notched structural plate 212y contacts control member 260.

Some embodiments provide the deflection illustrated in FIGS. 4B and 4C by activating the involved mirror actuator 224 and the involved control actuator 254, 264 simultaneously. Thus, for example, referring to FIG. 4B, right mirror actuator 224b and left control actuator 254a are activated at the same time. Because the distance between control member 250 and left control actuator 254a is less than the distance between structural plate 212 and right mirror actuator 224b, a larger force exists between control member 250 and left control actuator 254a. The larger force causes control member 250 to move into contact with base layer 204 before structural plate 212 contacts control member 250. Again, the prior description assumes similar energy in electric fields 230 and 238, as well as, similar restoring forces 360 and 375. As previously discussed, the actuator pairs which are activated simultaneously can be replaced by a single actuator capable of providing similar functionality.

Alternatively, left control actuator 254a is activated prior to activating right mirror actuator 224b. By activating left control actuator 254a prior to right mirror actuator 224b, control member 250 is brought into contact with base layer 204 before non-notched structural plate 212 contacts control member 250.

While the preceding embodiments are illustrated and described in relation to micromirror system 200 including two control members 250, 260, it should be recognized by one of ordinary skill in the art that only one, or more than two control members can be used in accordance with the present invention. Further, it should be recognized that one or more of structural plate 212 and/or control members 250, 260 can be of a cantilever configuration.

5. Overcoming Stiction

Some embodiments of the present invention are particularly applicable to overcoming stiction in MEMS devices. More specifically, FIGS. 5 and 6 illustrate various methods according to the present invention for overcoming stiction.

Figure 5A:
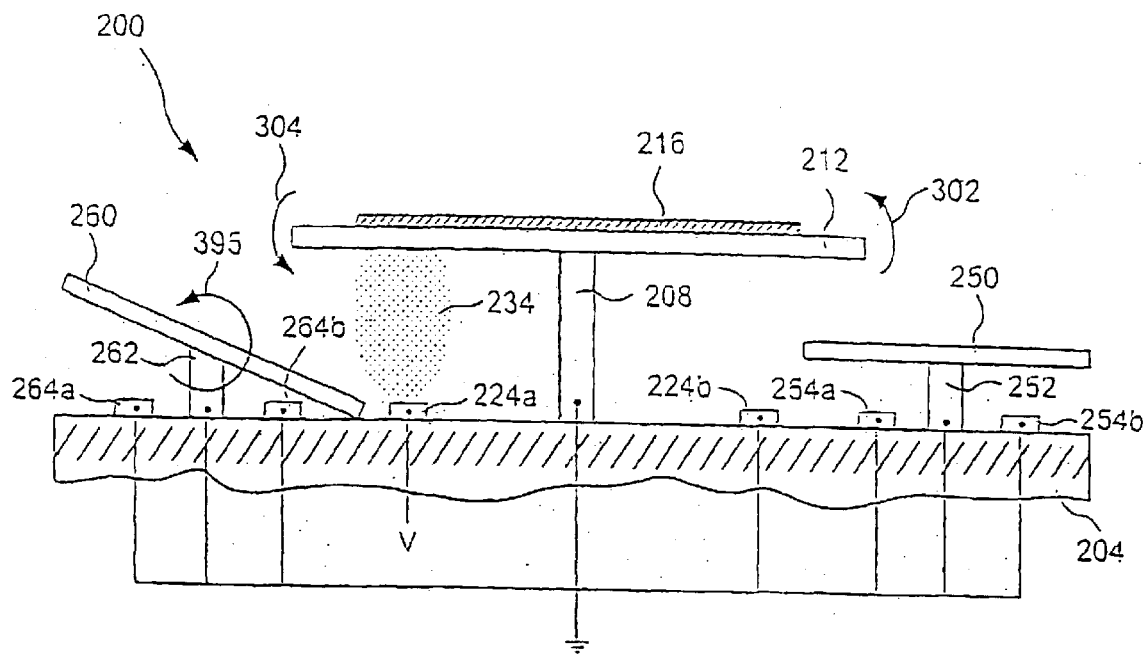
FIGS. 5A–5C are cross-sectional drawings of the micromirror and control plates of FIG. 4 wherein stiction is inhibiting operation.

FIG. 5A illustrates micromirror system 200 as depicted in FIG. 4C after deactivation of both right control actuator 264b and left mirror actuator 224a. More specifically, FIG. 5A illustrates micromirror system 200 where stiction related forces are larger than restoring force 395. Thus, when right control actuator 264b is deactivated, control member 260 remains in a right tilt position. Such a situation can occur, for example, where control member 260 is maintained in the same right tilt position for extended time periods.

The present invention provides a variety of options for overcoming such stiction. In some embodiments, left mirror actuator 224a is activated causing structural plate 212 to deflect as indicated by motion arrows 302 and 304. The deflection of structural plate 212 brings it into contact with control member 260 with sufficient force to, at least momentarily, dislodge whatever is causing the stiction related forces, whether it be a charge, molecule or other build-up. In some instances, the contact between structural plate 212 and control member 260 causes a mechanical, electrical, and/or combination disturbance. Having dislodged the stiction causing build-up, torsion force 395 acts to return control member 260 to its static horizontal position.

In addition to contacting control member 260 with structural plate 212, some embodiments activate left control actuator 264a. This results in an attractive force between left control actuator 264a and control member 260, which, when added to restoring force 395, is sufficient to overcome stiction related forces.

Figure 5B:
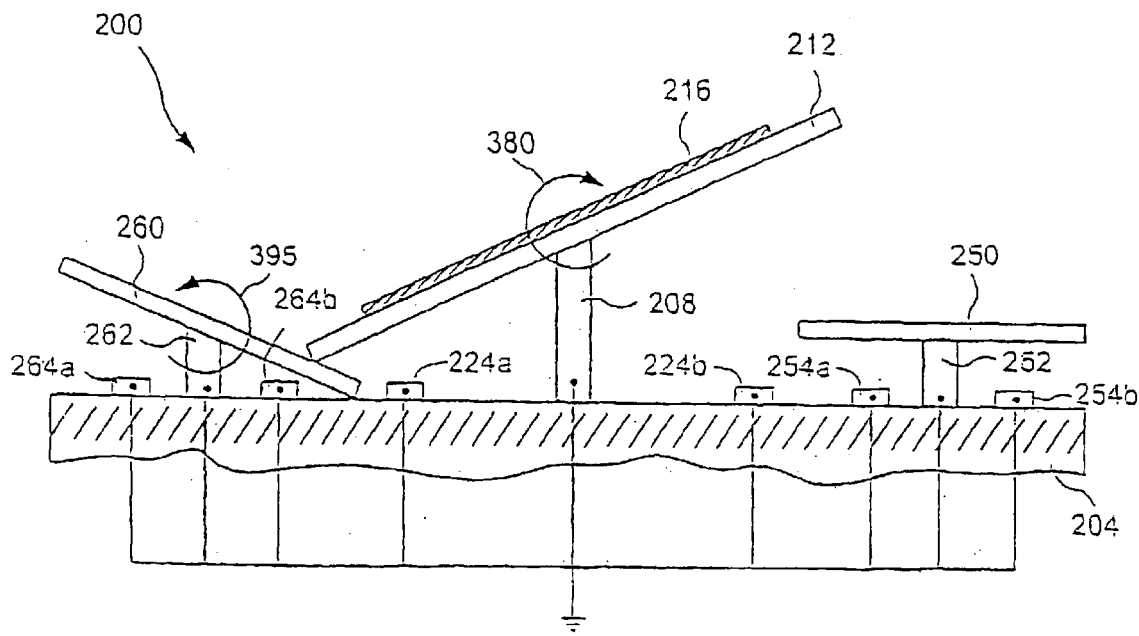

FIG. 5B illustrates an alternative situation where stiction results in both structural plate 212 and control member 260 remaining in a tilted position after all actuators are deactivated. It should be recognized that the present invention makes such a situation somewhat less likely because of the combination of restoring force 380 associated with structural plate 212 and restoring force 395 associated with control member 260 can be sufficient to overcome stiction related forces. However, the present invention provides additional options for overcoming such stiction beyond relying on the additive restoring forces.

Figure 5C:
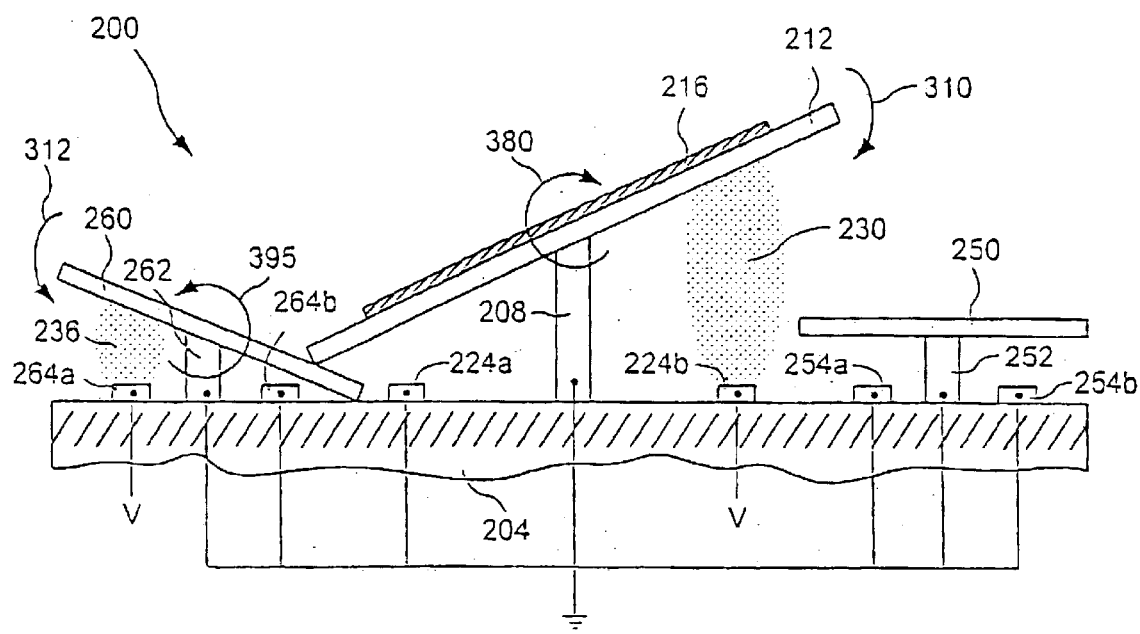

Referring to FIG. 5C, forces in addition to restoring forces 395 and 380 can be generated by activating either or both of left control actuator 264a and right mirror actuator 224b. By activating both actuators 264a, 224b, additive forces capable of overcoming any potential stiction include restoring forces 395 and 380, as well as, attractive forces from electric fields 230 and 236.

As the attractive force created by activating an actuator varies by the inverse of the distance from the actuator to the control member and/or structural plate, it should be recognized by one skilled in the art that where electrical field 230 is similar in strength to electric field 236, the attractive force between left control actuator 264a and control member 260 will be larger than the attractive force between right mirror actuator 224b and structural plate 212. Thus, in some embodiments, control member 260 is relatively short, which reduces the distance between control member 260 and left control actuator 264a. This reduction in distance can result in increased force from electric field 236 and can increase the force asserted by control member 260 acting to pry up structural plate 212 as illustrated in FIG. 5C.

Figure 6A:
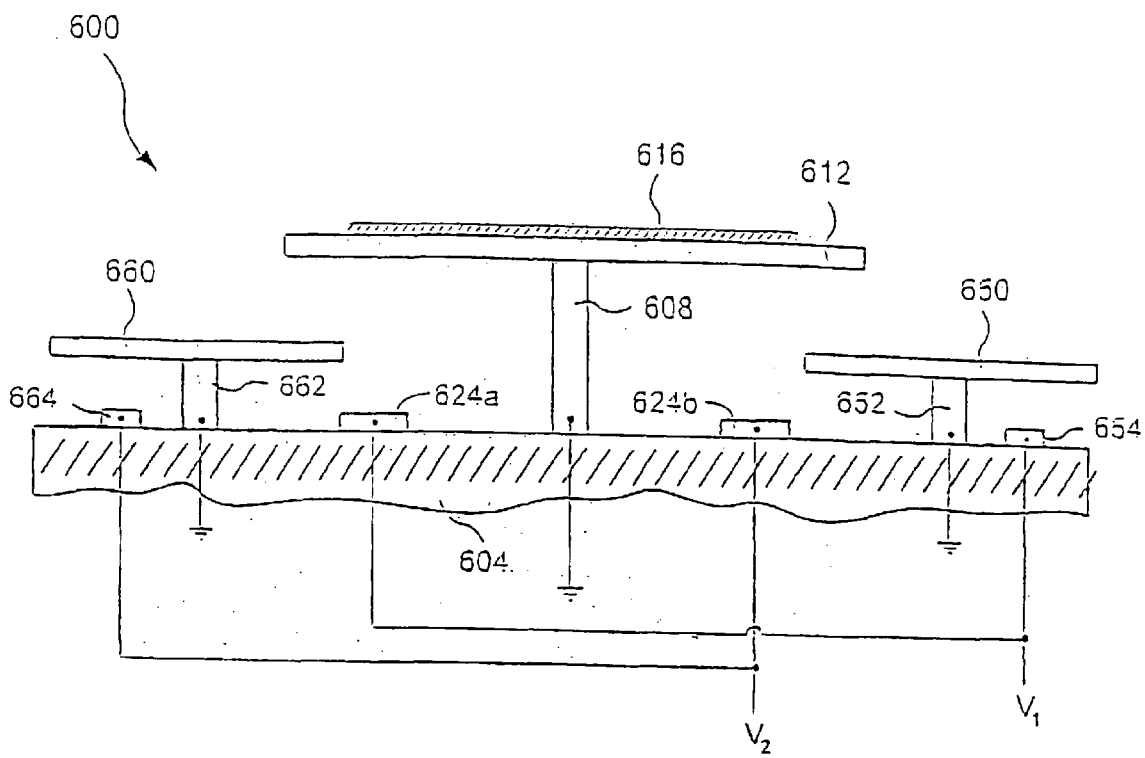
FIGS. 6A–6C are cross-sectional drawings of micromirror and control plates with an advantageous wiring and switching configuration according to the present invention.
Figure 6B:
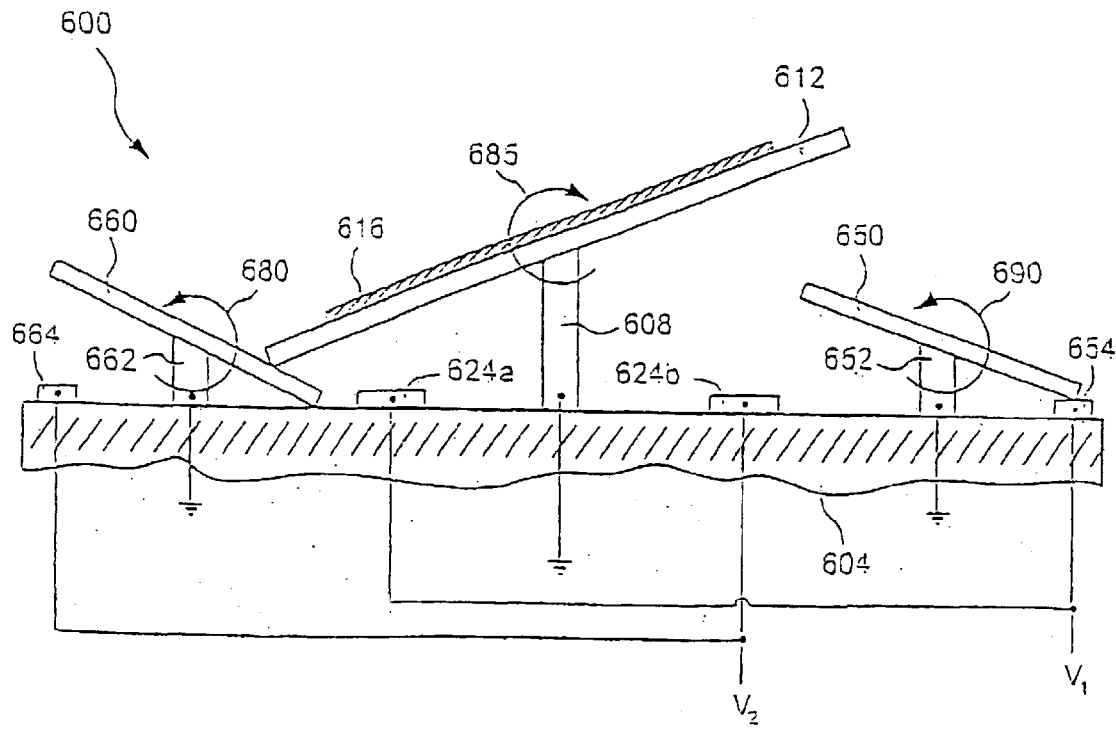
Figure 6C:
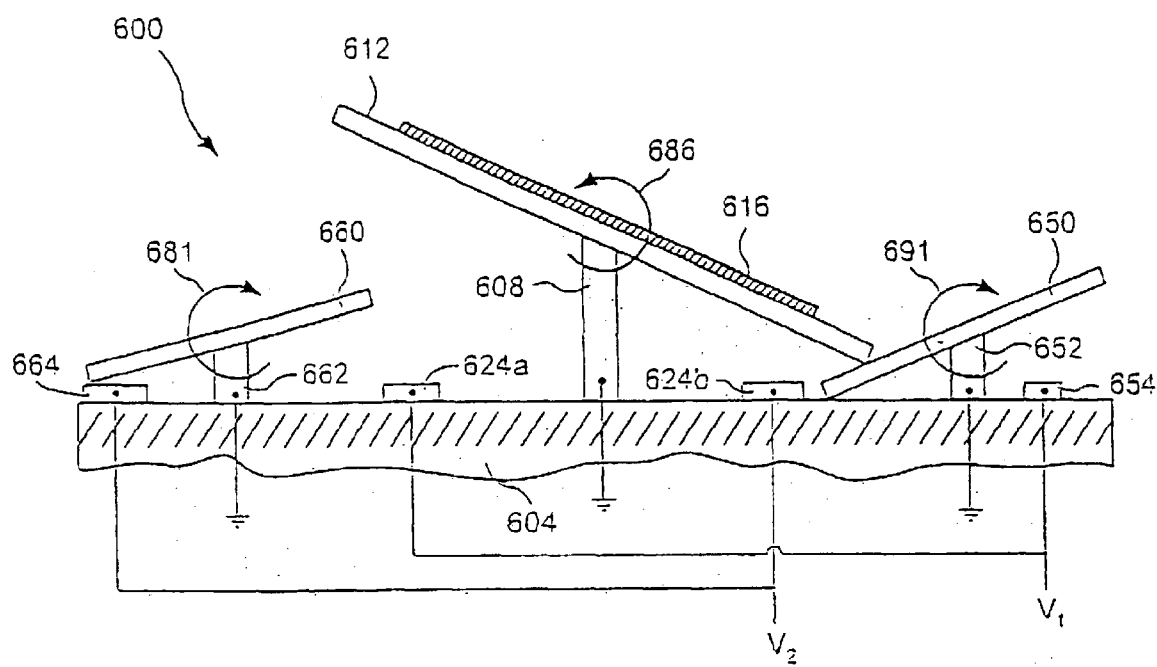

FIGS. 6A–6C illustrates a particularly advantageous micromirror system 600 which provides the prying action described in relation to FIG. 5C while using minimal actuators, wiring and control logic. FIG. 6A illustrates micromirror system 600 including a structural plate 612, a micromirror 616, a left control member 660, and a right control member 650. Structural plate 612 is supported by a pivot 608, while right and left control members 650, 660 are supported by pivots 652, 662, respectively. A left control actuator 664 is disposed beneath left control member 660 and over base layer 604. Similarly, a right control actuator 654 is disposed beneath right control member 650. A left mirror actuator 624a and a right mirror actuator 624b are disposed beneath structural plate 612 on either side of pivot 608.

As illustrated, micromirror system 600 is in a static horizontal configuration where each of structural plate 612 and control members 650 and 660 are in a horizontal position. Actuators 664 and 624b are connected to a voltage potential V2 and actuators 654 and 624a are connected to a voltage potential V1. The static horizontal configuration is achieved when all actuators 624a, 624b, 654, 664 are commonly grounded with pivots 608, 652, 662. Thus, in the static position, voltages V2 and V1 are equal to the potential of pivots 608, 652, 662.

A left tilt position of micromirror 616 is illustrated in FIG. 6B. The left tilt position is achieved by applying a voltage to V1, while maintaining V2 at a potential equal to pivots 608, 652, 662. By applying this voltage, actuator 624a is activated and the left side of structural plate 612 is attracted toward base layer 604. As base layer 612 moves toward base layer 604, it contacts left control member 660 and pulls it toward base layer 604. Ultimately, structural plate 612 comes to rest in contact with control member 660, where control member 660 is in contact with base layer 604. At the same time, actuator 654 is activated causing right control member 650 to deflect to the right until it contacts base layer 604.

In this position restoring forces 680, 685, 690 act to return base layer 612 and control members 650 and 660 to the static horizontal position. Thus, when all actuators 624a, 624b, 654, 664 are returned to a common potential with pivots 608, 652, 662, restoring forces, in the absence of stiction, cause base layer 612, and control members 650, 660 to assume a horizontal position. Both restoring forces 680 and 685 act to overcome any stiction forces causing base layer 612 to remain in the left tilted position illustrated in FIG. 6B.

Similarly, FIG. 6C illustrates a right tilt position of micromirror 616. The right tilt position is achieved by applying a voltage to V2, while maintaining V1 at a potential equal to pivots 608, 652, 662. By applying this voltage, actuator 624b is activated and the right side of structural plate 612 is attracted toward base layer 604. As base layer 612 moves toward base layer 604, it contacts right control member 650 and pulls it toward base layer 604. Ultimately, structural plate 612 comes to rest in contact with control member 650, where control member 650 is in contact with base layer 604. At the same time, actuator 664 is activated causing left control member 660 to deflect to the left until it contacts base layer 604.

In this position restoring forces 681, 686, 691 act to return base layer 612 and control members 650 and 660 to the static horizontal position. Both restoring forces 686 and 691 act to overcome any stiction forces causing base layer 612 to remain in the right tilted position illustrated in FIG. 6C.

In addition, stiction related forces can be overcome by actively prying structural plate 612 using either control member 650 or control member 660. Such active prying is precipitated by switching from the left tilt position to the right tilt position, or vice versa. This prying action is achieved with minimal control or circuitry because of the connection between actuators 624a and 654 and between actuators 624b and 664. Thus, as illustrated in FIG. 6, the structures according to the present invention can both be used to create additional tilt positions for a given structural plate and to create prying and/or tapping forces to overcome stiction.

For example, when switching from the left tilt position illustrated in FIG. 6B to the right tilt position illustrated in FIG. 6C, V2 is switched to from the prior applied voltage potential to a ground and V1 is switched from ground to a voltage potential. This switching not only causes structural plate 612 to move from a left tilt to a right tilt, it causes control member 660 to act as a lever to overcome any stiction forces impeding the movement of structural plate 612. As previously described, the lever force provided by control member 660 can be large due to the proximity of control member 660 and actuator 664. It should be recognized that a similar lever action involving control member 650 can be achieved when switching structural plate 612 from a right tilt position to a left tilt position.

6. Fiber-Optics Applications a. Wavelength Router

Tilting micromirrors according to the embodiments described above, and their equivalents, may be used in numerous applications as parts of optical switches, display devices, or signal modulators, among others. One particular application of such tilting micromirrors is as optical switches in a wavelength router such as may be used in fiberoptic telecommunications systems. One such wavelength router is described in detail in the copending, commonly assigned U.S. patent application, filed Nov. 16, 1999 and assigned Ser. No. 09/442,061 now U.S. Pat. No. 6,501,877, entitled "Wavelength Router," which is herein incorporated by reference in its entirety, including the Appendix, for all purposes. The various micromirror embodiments may be used in that wavelength router or may be incorporated into other wavelength routers as optical switches where it is desirable to avoid stiction problems.

Wavelength routing functions may be performed optically with a free-space optical train disposed between the input ports and the output ports, and a routing mechanism. The free-space optical train can include air-spaced elements or can be of generally monolithic construction. The optical train includes a dispersive element such as a diffraction grating, and is configured so that the light from the input port encounters the dispersive element twice before reaching any of the output ports. The routing mechanism includes one or more routing elements and cooperates with the other elements in the optical train to provide optical paths that couple desired subsets of the spectral bands to desired output ports. The routing elements are disposed to intercept the different spectral bands after they have been spatially separated by their first encounter with the dispersive element.

Figure 7A:
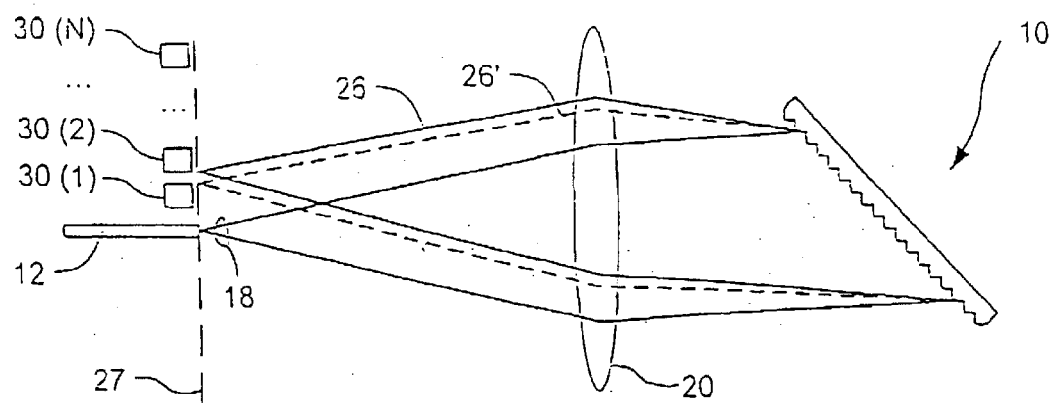
FIGS. 7A, 7B, and 7C are schematic top, side, and end views, respectively, of one embodiment of a wavelength router that uses spherical focusing elements.
Figure 7B:
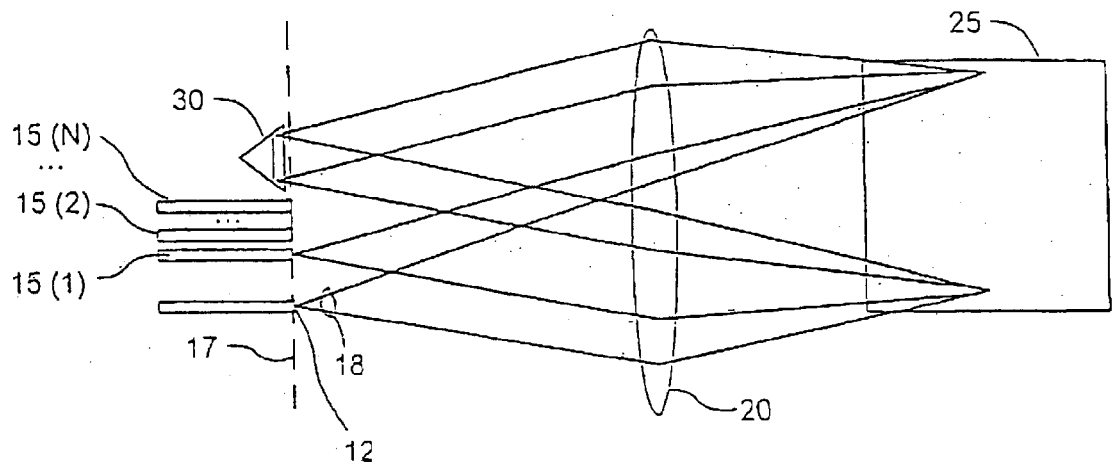
Figure 7C:
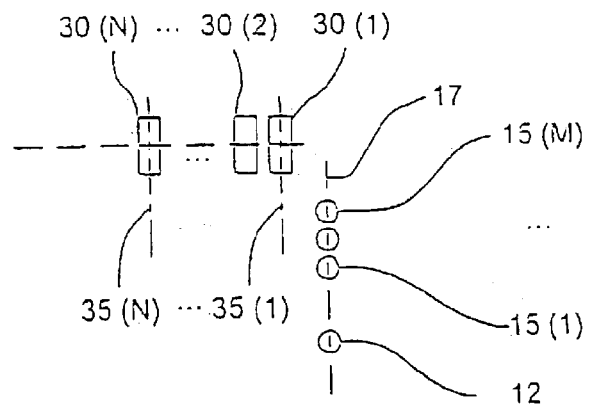

FIGS. 7A, 7B, and 7C are schematic top, side, and end views, respectively, of one embodiment of a wavelength router 10. Its general functionality is to accept light having a plurality N of spectral bands at an input port 12, and to direct subsets of the spectral bands to desired ones of a plurality M of output ports, designated 15(1) . . . 15(M). The output ports are shown in the end view of FIG. 7C as disposed along a line 17 that extends generally perpendicular to the top view of FIG. 7A. Light entering the wavelength router 10 from input port 12 forms a diverging beam 18, which includes the different spectral bands. Beam 18 encounters a lens 20 that collimates the light and directs it to a reflective diffraction grating 25. The grating 25 disperses the light so that collimated beams at different wavelengths are directed at different angles back towards the lens 20.

Two such beams are shown explicitly and denoted 26 and 26', the latter drawn in dashed lines. Since these collimated beams encounter the lens 20 at different angles, they are focused towards different points along a line 27 in a transverse plane extending in the plane of the top view of FIG. 7A. The focused beams encounter respective ones of a plurality of retroreflectors that may be configured according as contactless micromirror optical switches as described above, designated 30(1) . . . 30(N), located near the transverse plane. The beams are directed back, as diverging beams, to the lens 20 where they are collimated, and directed again to the grating 25. On the second encounter with the grating 25, the angular separation between the different beams is removed and they are directed back to the lens 20, which focuses them. The retroreflectors 30 may be configured to send their intercepted beams along a reverse path displaced along respective lines 35(1) . . . 35(N) that extend generally parallel to line 17 in the plane of the side view of FIG. 7B and the end view of FIG. 2C, thereby directing each beam to one or another of output ports 15.

Another embodiment of a wavelength router, designated 10', is illustrated with schematic top and side views in FIGS. 9A and 9B, respectively. This embodiment may be considered an unfolded version of the embodiment of FIGS. 7A–7C. Light entering the wavelength router 10' from input port 12 forms diverging beam 18, which includes the different spectral bands. Beam 18 encounters a first lens 20a, which collimates the light and directs it to a transmissive grating 25'. The grating 25' disperses the light so that collimated beams at different wavelengths encounter a second lens 20b, which focuses the beams. The focused beams are reflected by respective ones of plurality of retroreflectors 30, which may also be configured as contactless micromirror optical switches, as diverging beams, back to lens 20b, which collimates them and directs them to grating 25'. On the second encounter, the grating 25' removes the angular separation between the different beams, which are then focused in the plane of output ports 15 by lens 20a.

Figure 8A:
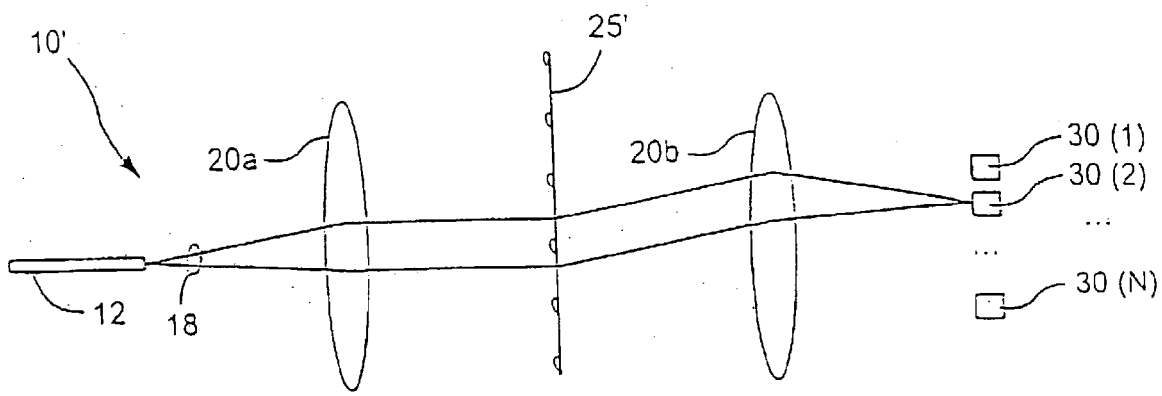
FIGS. 8A and 8B are schematic top and side views, respectively, of a second embodiment of a wavelength router that uses spherical focusing elements.
Figure 8B:
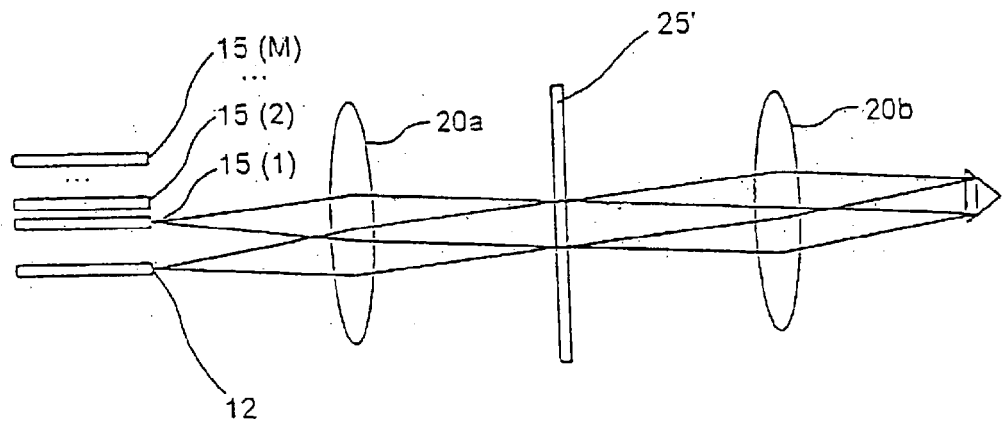
Figure 9:
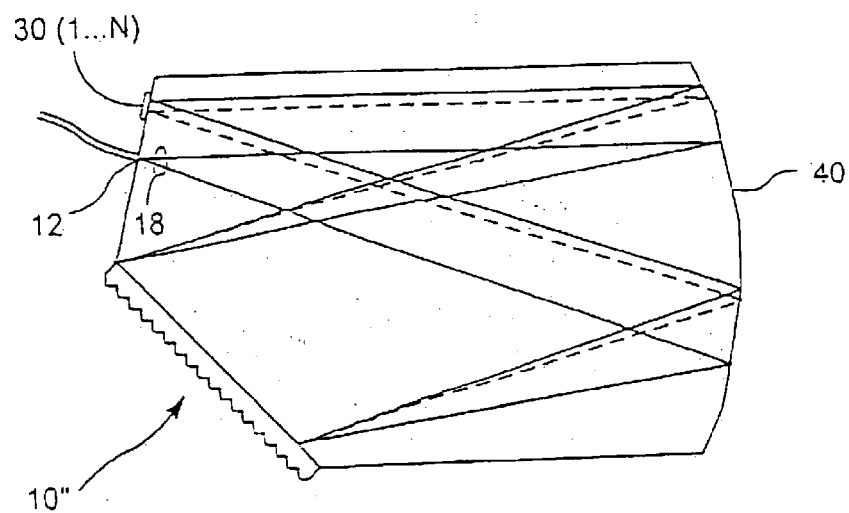
FIG. 9 is a schematic top view of a third embodiment of a wavelength router that uses spherical focusing elements.

A third embodiment of a wavelength router, designated 10", is illustrated with the schematic top view shown in FIG. 9. This embodiment is a further folded version of the embodiment of FIGS. 7A–7C, shown as a solid glass embodiment that uses a concave reflector 40 in place of lens 20 of FIGS. 7A–7C or lenses 20a and 20b of FIGS. 8A–8B. Light entering the wavelength router 10" from input port 12 forms diverging beam 18, which includes the different spectral bands. Beam 18 encounters concave reflector 40, which collimates the light and directs it to reflective diffraction grating 25, where it is dispersed so that collimated beams at different wavelengths are directed at different angles back towards concave reflector 40. Two such beams are shown explicitly, one in solid lines and one in dashed lines. The beams then encounter retroreflectors 30 and proceed on a return path, encountering concave reflector 40, reflective grating 25', and concave reflector 40, the final encounter with which focuses the beams to the desired output ports. Again, the retroreflectors 30 may be configured as contactless micromirror optical switches.

b. Optical-Switch Retroreflector Implementations

Figure 10A:
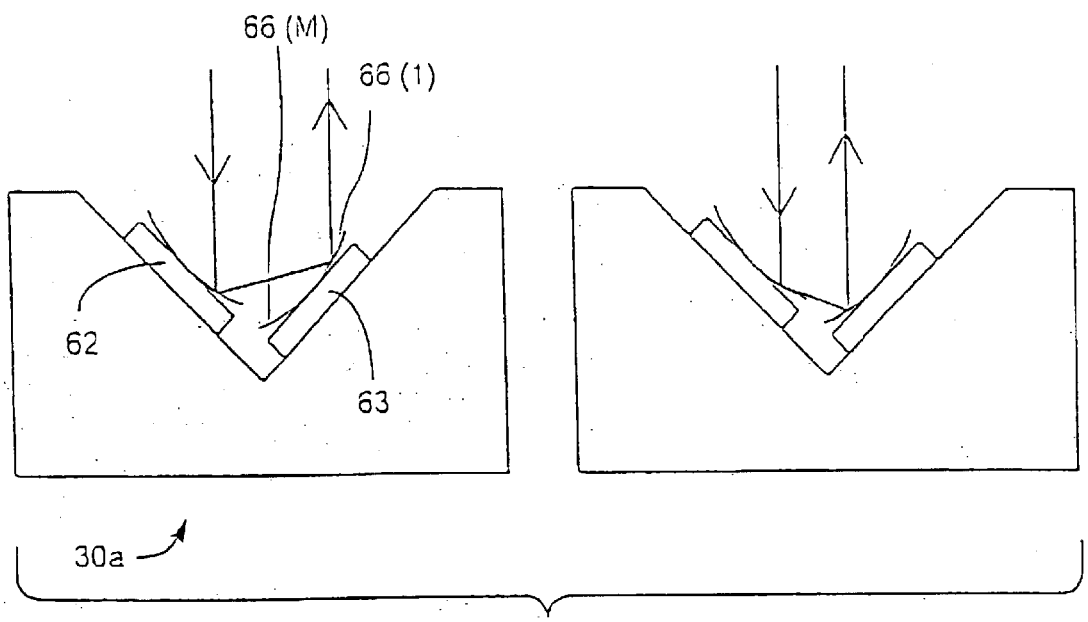
FIGS. 10A and 10B are side and top views of an implementation of a micromirror retroreflector array.
Figure 10B:
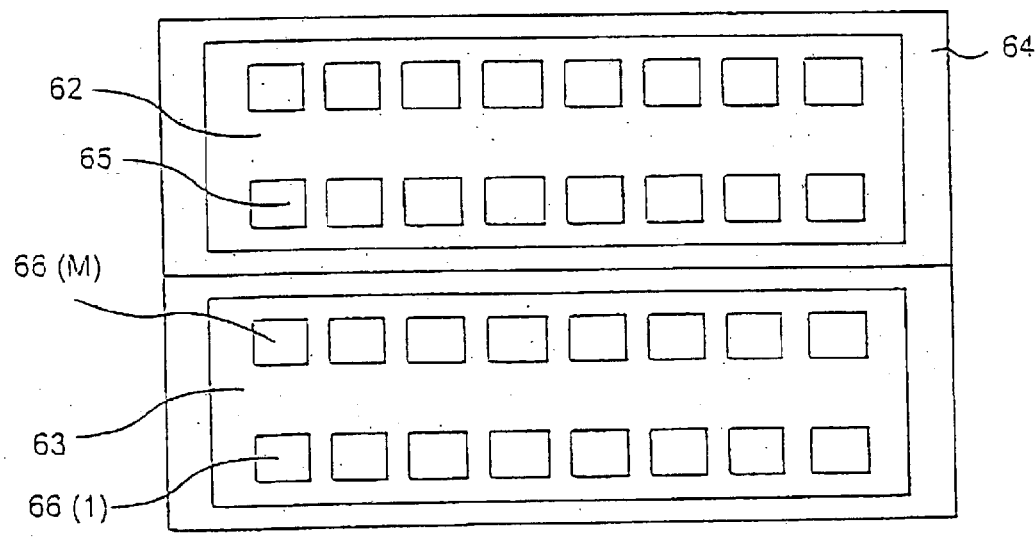

FIG. 10A shows schematically the operation of a retroreflector, designated 30a, that uses contactless-micromirror optical switches. FIG. 10B is a top view. A pair of micromirror arrays 62 and 63 is mounted to the sloped faces of a V-block 64. A single micromirror 65 in micromirror array 62 and a row of micromirrors 66(1 . . . M) in micromirror array 63 define a single retroreflector. Micromirror arrays may conveniently be referred to as the input and output micromirror arrays, with the understanding that light paths are reversible. The left portion of the figure shows micromirror 65 in a first orientation so as to direct the incoming beam to micromirror 66(1), which is oriented 90° with respect to micromirror 65's first orientation to direct the beam back in a direction opposite to the incident direction. The right half of the figure shows micromirror 65 in a second orientation so as to direct the incident beam to micromirror 66(M). Thus, micromirror 65 is moved to select the output position of the beam, while micromirrors 66(1 . . . M) are fixed during normal operation. Micromirror 65 and the row of micromirrors 66(1 . . . M) can be replicated and displaced in a direction perpendicular to the plane of the figure. While micromirror array 62 need only be one-dimensional, it may be convenient to provide additional micromirrors to provide additional flexibility.

In one embodiment, the micromirror arrays are planar and the V-groove has a dihedral angle of approximately 90° so that the two micromirror arrays face each other at 90°. This angle may be varied for a variety of purposes by a considerable amount, but an angle of 90° facilitates routing the incident beam with relatively small angular displacements of the micromirrors. In certain embodiments, the input micromirror array has at least as many rows of micromirrors as there are input ports (if there are more than one), and as many columns of mirrors as there are wavelengths that are to be selectably directed toward the output micromirror array. Similarly, in some embodiments, the output micromirror array has at least as many rows of micromirrors as there are output ports, and as many columns of mirrors as there are wavelengths that are to be selectably directed to the output ports.

In a system with a magnification factor of one-to-one, the rows of micromirrors in the input array are parallel to each other and the component of the spacing from each other along an axis transverse to the incident beam corresponds to the spacing of the input ports. Similarly, the rows of micromirrors in the output array are parallel to each other and spaced from each other (transversely) by a spacing corresponding to that between the output ports. In a system with a different magnification, the spacing between the rows of mirrors would be adjusted accordingly.

7. Conclusion

The invention has now been described in detail for purposes of clarity and understanding. However, it will be appreciated that certain changes and modifications may be practiced within the scope of the appended claims. For example, additional actuators and/or control members can be added to provide additional aspects according to the present invention. Such additional aspects can include mounting the structural plate on a post and adding actuators disposed under the front and rear sides of the structural plate such that the structural plate can be deflected to the right, left, front, rear, or combinations thereof.

Thus, although the invention is described with reference to specific embodiments and figures thereof, the embodiments and figures are merely illustrative, and not limiting of the invention. Rather, the scope of the invention is to be determined solely by the appended claims.

What is claimed is:

1. A method for manipulating a first plate in a MEMS device relative to a second plate in a MEMS device, the method comprising:
   providing a first actuator and a second actuator disposed above a base layer;
   providing the first plate supported by a first pivot, wherein the first plate is disposed above the first actuator and the first pivot is disposed above the base layer between the first actuator and the second actuator;
   providing a second plate supported by a second pivot wherein the second plate is disposed above the second actuator and the second pivot is disposed above the base layer;
   activating the second actuator to cause the second plate to impact the first plate;
   wherein the first plate comprises a mirror, and wherein the second plate comprises a mirror.

2. The method of claim 1, wherein the impact is a first impact, the method further comprising:
   deactivating the second actuator, wherein the second plate moves away from the first plate; and
   reactivating the second actuator to cause the second plate to impact the first plate for a second time.

3. The method of claim 1, the method further comprising:
   activating the first actuator to create an actuator force on the first plate, wherein the actuator force on the first plate encourages the first plate to deflect toward the second plate.

4. An apparatus adapted for encouraging a structural plate in a MEMS device to deflect toward a static position, the apparatus comprising:
   a base layer;
   a first pivot and a second pivot disposed on the base layer;
   a first structural plate supported by the first pivot and disposed above the base layer, wherein the first structural plate is deflected away from the static position;
   a second structural plate supported by the second pivot and disposed above the base layer; and
   wherein the second structural plate is movable to generate a physical force, and wherein the physical force encourages the first structural plate to move toward the static position.

5. The apparatus of claim 4, the apparatus further comprising:
   a first actuator for deflecting the first structural plate;
   a second actuator for deflecting the second structural plate; and
   wherein the first and second actuators are electrically coupled.

6. The apparatus of claim 4, wherein the first actuator is operable to deflect the first structural plate toward the base layer at a position away from the second structural plate, the apparatus further comprising:
   a third actuator operable to deflect the first structural plate toward the base layer at a position near the second structural plate.

7. A MEMS device adapted for overcoming a stiction force incident at a stop position, the device comprising:
   a base layer;
   a first plate supported by a first pivot, wherein the first plate is disposed above the base layer and the first pivot is disposed on the base layer;
   a second plate supported by a second pivot, wherein the second plate is disposed above the base layer and the second pivot is disposed on the base layer;

a first actuator for deflecting the first plate and a second actuator for deflecting the second plate, wherein the first actuator is electrically connected to the second actuator; and wherein energizing the first and second actuators causes the first plate to deflect away from the second plate and the second plate to deflect away from the first plate.

8. A method for generating a physical force in an electromechanical device, the method comprising:

providing a base layer;

providing a first pivot and a second pivot disposed on the base layer;

providing a first structural plate supported by the first pivot and disposed above the base layer;

providing a second structural plate supported by the second pivot and disposed above the base layer; and deflecting the second structural plate to contact the first structural plate;

wherein deflecting the second structural plate is caused, at least in part, by a restorative force between the second structural plate and the second pivot.

9. The method of claim 8, the method further comprising;

providing an actuator disposed on the base layer and under the second structural plate; and activating the actuator to create an electric field force, wherein the deflecting the second structural plate is caused, at least in part, by the electric field force.

10. The method of claim 8, the method further comprising:

providing a first actuator disposed on the base layer and under the first structural plate;

providing a second actuator disposed on the base layer and under the second structural plate; and activating the first actuator, wherein the first actuator creates a first electric field force;

activating the second actuator, wherein the second actuator creates a second electric field force, wherein the deflecting the second structural plate is caused, at least in part, by a combination of the second electric field force and a restorative force between the second structural plate and the second pivot.

11. The method of claim 8, wherein the deflecting the second structural plate comprises moving the second structural plate into contact with the first structural plate.

12. The method of claim 8, wherein a stiction force exists at a point of contact between the first structural plate and the base layer, and wherein a combination of a restorative force between the first structural plate and the first pivot and the disturbance in the molecule build-up or adhesion force is sufficient to overcome the stiction force.

13. The method of claim 8, the method further comprising:

providing an actuator disposed on the base layer and under the second structural plate; and activating the actuator to create an electric field force, wherein the deflecting the second structural plate is caused, at least in part, by the electric field force, and wherein a first impact occurs between the first structural plate and the second structural plate;

deactivating the actuator, wherein the second structural plate moves away from the first structural plate; and reactivating the actuator to create the electric field force, wherein a second impact occurs between the first structural plate and the second structural plate.

* * * * *